(12) United States Patent
Du et al.

(10) Patent No.: US 11,867,748 B2
(45) Date of Patent: Jan. 9, 2024

(54) ELECTRICAL CONTROL DEVICE DETECTION CIRCUIT, DETECTION METHOD, AND ELECTRIC VEHICLE

(71) Applicant: CONTEMPORARY AMPEREX TECHNOLOGY CO., LIMITED, Ningde (CN)

(72) Inventors: Baohai Du, Ningde (CN); Changjian Liu, Ningde (CN); Yanhui Fu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 160 days.

(21) Appl. No.: 17/552,348

(22) Filed: Dec. 15, 2021

(65) Prior Publication Data

US 2022/0107353 A1 Apr. 7, 2022

Related U.S. Application Data

(63) Continuation of application No. PCT/CN2020/110652, filed on Aug. 22, 2020.

(30) Foreign Application Priority Data

Aug. 30, 2019 (EH) .......................... 201910818417.1

(51) Int. Cl.
*G01R 31/00* (2006.01)
*G01R 31/28* (2006.01)
(Continued)

(52) U.S. Cl.
CPC ............ *G01R 31/282* (2013.01); *B60L 50/60* (2019.02); *G05B 23/02* (2013.01); *B60L 2240/40* (2013.01)

(58) Field of Classification Search
CPC ........ G01R 31/00; G01R 31/28; G01R 31/52; G05B 23/02; B60L 50/60
See application file for complete search history.

(56) References Cited

U.S. PATENT DOCUMENTS

2001/0005028 A1 6/2001 Shimoida et al.
2017/0365430 A1 12/2017 Katrak et al.

FOREIGN PATENT DOCUMENTS

| CN | 203658552 U | 6/2014 |
|---|---|---|
| CN | 203720299 U | 7/2014 |

(Continued)

OTHER PUBLICATIONS

Contemporary Amperex Technology Co., Limited, International Search Report and Written Opinion, PCT/CN2020/110652, dated Nov. 12, 2020, 17 pgs.

(Continued)

*Primary Examiner* — Neel D Shah
(74) *Attorney, Agent, or Firm* — Kilpatrick Townsend & Stockton LLP

(57) ABSTRACT

This application discloses an electrical control device detection circuit, a detection method, and an electric vehicle. The detection circuit includes a drive circuit configured to detect an electrical control device. The drive circuit includes a drive power module, a high-side switch unit, and a low-side switch unit. The detection circuit includes: a detection power module, a first switch module, a second switch module, a first detection module, a second detection module, and a control module. The control module is configured to obtain an electrical signal at a third end of the first detection module and/or an electrical signal at a second end of the second detection module; and determine, based on the electrical signal at the third end of the first detection module and/or the electrical signal at the second end of the second detection (Continued)

module, whether a fault occurs in the drive circuit of the electrical control device.

22 Claims, 17 Drawing Sheets

(51) Int. Cl.
*G01R 31/52* (2020.01)
*G05B 23/02* (2006.01)
*B60L 50/60* (2019.01)

(56) References Cited

FOREIGN PATENT DOCUMENTS

| CN | 105490255 | A | 4/2016 | | |
| CN | 103176070 | B | 6/2016 | | |
| CN | 107305356 | A | 10/2017 | | |
| CN | 107422257 | A | 12/2017 | | |
| CN | 107976626 | A | 5/2018 | | |
| CN | 208027164 | U | 10/2018 | | |
| CN | 109254245 | A | 1/2019 | | |
| CN | 109541457 | | * | 3/2019 | ......... G01R 31/3275 |
| CN | 109541457 | A | 3/2019 | | |
| CN | 109581192 | A | 4/2019 | | |
| CN | 209296880 | U | 8/2019 | | |
| EP | 642028 | A1 | 3/1995 | | |
| KR | 1020160079507 | A | 7/2016 | | |

OTHER PUBLICATIONS

First Office Action of the counterpart CN application No. CN201910818417.1, dated Nov. 14, 2023.

Shourong Lu, "Circuit Analysis and Methods of Fault-detection for Automobile Starting-System", published on Industrial Control Computer on Dec. 31, 2018, pp. 150-151 and 155.

* cited by examiner

ELECTRICAL CONTROL DEVICE DETECTION CIRCUIT, DETECTION METHOD, AND ELECTRIC VEHICLE

CROSS-REFERENCE TO RELATED APPLICATIONS

This application is a continuation application of PCT Patent Application No. PCT/CN2020/110652, entitled "DETECTION CIRCUIT AND DETECTION METHOD FOR ELECTRIC CONTROL DEVICE, AND ELECTRIC VEHICLE" filed on Aug. 22, 2020, which claims priority to Chinese Patent Application No. 201910818417.1, filed with the State Intellectual Property Office of the People's Republic of China on Aug. 30, 2019, and entitled "ELECTRICAL CONTROL DEVICE DETECTION CIRCUIT AND DETECTION METHOD", all of which are incorporated herein by reference in their entirety.

TECHNICAL FIELD

Embodiments of this application relate to the technical field of electronics, and in particular, to an electrical control device detection circuit, a detection method, and an electric vehicle.

BACKGROUND

Currently, electric vehicles in place of fuel vehicles have become an evolution trend of the automotive industry. Because intrinsic power of a motor of an electric vehicle is relatively high, a currently available battery pack basically adopts a high-voltage low-current solution or a low-voltage and high-current solution. However, the voltage of the battery pack, even if relatively low, is still far higher than a safe voltage. Therefore, a controller controls a high-voltage loop indirectly by using a relay. Nevertheless, the relay is a mechanical switch after all, and may face an aging problem after a long time of work. This further leads to circumstances of failure of the relay or a wiring harness connected to the relay. Such circumstances exert a significant impact on safe operation of the vehicle, and diagnosis of the relay becomes essential.

However, at least the following problems are found in the related art: a fault diagnosis solution is currently lacking for a drive circuit of the relay.

It needs to be noted that the information disclosed in the background technology section above is merely intended for ease of understanding the background of the present disclosure, and therefore, may include information that does not constitute a related technology known to a person of ordinary skill in the art.

SUMMARY

An objective of embodiments of this application is to provide an electrical control device detection circuit, a detection method, and an electric vehicle to perform fault diagnosis on a drive circuit of an electric control device.

To achieve the foregoing technical objective, an embodiment of this application provides an electrical control device detection circuit. The detection circuit is configured to detect a drive circuit of an electrical control device. The drive circuit of the electrical control device includes a drive power module, a high-side switch unit, and a low-side switch unit. The drive power module is connected to a first end of the high-side switch unit. A second end of the high-side switch unit is connected to a first end of the electrical control device. A first end of the low-side switch unit is connected to a second end of the electrical control device. A second end of the low-side switch unit is grounded. The detection circuit includes: a detection power module, a first switch module, a second switch module, a first detection module, a second detection module, and a control module. An output end of the detection power module is connected to a first end of the first switch module. A second end of the first switch module is connected to the first end of the electrical control device. A first end of the first detection module is connected to a first node between the second end of the first switch module and the first end of the electrical control device. A second end of the first detection module is connected to the second end of the electrical control device. A third end of the first detection module is connected to the control module. A first end of the second detection module is connected to a second node between the second end of the electrical control device and the second end of the first detection module. A second end of the second detection module is connected to the control module. A third end of the second detection module is grounded. The first switch module and the second switch module are connected to the control module separately. The second switch module is serially connected between the first end of the first detection module and the first node, or, the second switch module is serially connected between the second end of the first detection module and the second node. The control module is configured to obtain an electrical signal at the third end of the first detection module and/or an electrical signal at the second end of the second detection module; and determine, based on the electrical signal at the third end of the first detection module and/or the electrical signal at the second end of the second detection module, whether a fault occurs in the drive circuit of the electrical control device.

An embodiment of this application further provides an electrical control device detection method. The detection method is applied to a control module in the electrical control device detection circuit mentioned in the preceding embodiment. The detection method includes: obtaining an electrical signal at a third end of a first detection module and/or an electrical signal at a second end of a second detection module; and determining, based on the electrical signal at the third end of the first detection module and/or the electrical signal at the second end of the second detection module, whether a fault occurs in a drive circuit of an electrical control device.

An embodiment of this application further provides an electric vehicle, including an electrochemical device, an electrical control device, and any detection circuit described above.

In contrast with the prior art, in this embodiment of this application, depending on whether the drive circuit of the electrical control device is normal or faulty, electrical conducting status differs, and a voltage at the first end of the electrical control device and/or a voltage at the second end of the electrical control device in the drive circuit differ, thereby making circuit conducting status of the first detection module and/or the second detection module different. Therefore, based on the electrical signal at the third end of the first detection module and/or the electrical signal at the second end of the second detection module, it can be determined whether a fault occurs in the drive circuit, and the fault of the drive circuit of the electrical control device can be detected.

In addition, the first detection module includes a first power submodule, a first current-limiting submodule, and a switch element. A first end of the switch element serves as the first end of the first detection module, a second end of the switch element serves as the second end of the first detection module, a third end of the switch element is connected to the first power submodule by the first current-limiting submodule, a fourth end of the switch element is grounded, and the third end of the switch element serves as the third end of the first detection module. Alternatively, a third end of the switch element is connected to the first power submodule, a fourth end of the switch element is connected to a first end of the first current-limiting submodule, a second end of the first current-limiting submodule is grounded, and the first end of the first current-limiting submodule serves as the third end of the first detection module. When a current flows from the first end of the switch element to the second end of the switch element, an electrically conductive path is formed between the third end of the switch element and the fourth end of the switch element.

In addition, the detection circuit further includes a first current-limiting module. The first end of the first detection module is connected to the first node by the first current-limiting module. This implementation can avoid damage to a device in the first detection module caused by an excessive current flowing through the first detection module.

In addition, the detection circuit further includes a filter module. The third end of the first detection module is connected to the control module by the filter module. In this implementation, high stability of a detection signal at the third end of the first detection module is ensured.

In addition, the first detection module includes: a first power submodule, a filter submodule, a first current-limiting submodule, and a switch element. A first end of the switch element serves as the first end of the first detection module. A second end of the switch element serves as the second end of the first detection module. A third end of the switch element is connected to the first power submodule by the first current-limiting submodule. A fourth end of the switch element is connected to a first end of the filter submodule. A second end of the filter submodule is grounded. A third end of the filter submodule serves as the third end of the first detection module.

In addition, the switch element is any one of a photocoupler, a relay, a reed switch, or an optical field effect transistor.

In addition, the second detection module includes a second power submodule, a second current-limiting submodule, and a switch transistor. The second power submodule is connected to a first end of the switch transistor by the second current-limiting submodule. A second end of the switch transistor serves as the third end of the second detection module. A control end of the switch transistor serves as the first end of the second detection module. The first end of the switch transistor serves as the second end of the second detection module.

In addition, the detection circuit further includes a second current-limiting module. A second end of the second detection module is connected to the control module by the second current-limiting module. This implementation can avoid problems such as: an excessive current flowing from the second end of the second detection module to the control module causes damage to the control module.

In addition, the detection power module includes a third power submodule and a voltage divider submodule. The third power submodule is connected to a first end of the voltage divider submodule. A second end of the voltage divider submodule serves as an output end of the detection power module.

In addition, the detection circuit further includes a freewheeling module. The freewheeling module is parallel-connected to the electrical control device. This implementation can avoid a circumstance that an induced electromotive force generated by the electrical control device burns out a device in the circuit.

In addition, the freewheeling module includes a transient voltage suppression diode.

In addition, the detection circuit further includes a third detection module. A first end of the third detection module is connected to the first end of the high-side switch unit. A second end of the third detection module is connected to the control module. The control module is further configured to determine, based on an electrical signal at the second end of the third detection module, whether a fault occurs in the drive power module. In this implementation, fault detection can be performed on the drive power module when the electrical control device is disabled.

In addition, the control module includes a processing submodule and a first multiplexing submodule. The processing submodule is connected to the third end of the first detection module and the second end of the second detection module by the first multiplexing submodule separately. In this implementation, a "one-to-many" detection function of a processor port is implemented.

In addition, the control module includes a processing submodule and a second multiplexing submodule. The processing submodule is connected to the high-side switch unit and the low-side switch unit by the second multiplexing submodule separately. In this implementation, a "one-to-many" control function of the processor port is implemented.

In addition, the "obtaining an electrical signal at a third end of a first detection module and an electrical signal at a second end of a second detection module, and determining, based on the electrical signal at the third end of the first detection module and the electrical signal at the second end of the second detection module, whether a fault occurs in a drive circuit of an electrical control device" specifically includes: closing a first switch module when a low-side switch unit is in a disabled state; obtaining a first electrical signal at the second end of the second detection module; closing a second switch module when it is determined that a level of the first electrical signal is not a preset first level, and obtaining a second electrical signal at the third end of the first detection module; and determining a fault type of the drive circuit of the electrical control device based on the second electrical signal.

In addition, the determining a fault type of the drive circuit of the electrical control device based on the second electrical signal specifically includes: determining whether a level of the second electrical signal is a preset second level; determining, if a determining result is that the level of the second electrical signal is the preset second level, that the fault type of the drive circuit of the electrical control device is an open-circuit fault; or determining, if a determining result is that the level of the second electrical signal is not the preset second level, that the fault type of the drive circuit of the electrical control device is a shorted-to-ground fault.

In addition, before closing the first switch module, the electrical control device detection method further includes: determining that no shorted-to-power-supply fault occurs in the drive circuit of the electrical control device.

In addition, a method for determining whether a shorted-to-power-supply fault occurs in the drive circuit of the electrical control device is: obtaining a third electrical signal at the second end of the second detection module when both the first switch module and the second switch module are in an off state; determining whether a level of the third electrical signal is the first level; determining, if a determining result is that the level of the third electrical signal is the first level, that a shorted-to-power-supply fault occurs in the drive circuit of the electrical control device; or, determining, if a determining result is that the level of the third electrical signal is not the first level, that no shorted-to-power-supply fault occurs in the drive circuit of the electrical control device.

In addition, the "obtaining an electrical signal at a second end of a second detection module, and determining, based on the electrical signal at the second end of the second detection module, whether a fault occurs in a drive circuit of the electrical control device" specifically includes: enabling a low-side switch unit when a first switch module is in a closed state; obtaining a fourth electrical signal at the second end of the second detection module; and determining whether a level of the fourth electrical signal is a preset second level; determining, if a determining result is that the level of the fourth electrical signal is the preset second level, that the low-side switch unit is enabled normally; or determining, if a determining result is that the level of the fourth electrical signal is not the preset second level, that the low-side switch unit is enabled abnormally.

In addition, after determining that the low-side switch unit is enabled normally, the electrical control device detection method further includes: turning off the first switch module and the low-side switch unit; obtaining a fifth electrical signal at a second end of a third detection module; determining whether a voltage of the fifth electrical signal falls within a preset range; determining, if a determining result is that the voltage of the fifth electrical signal falls within the preset range, that a drive power module is normal; or determining, if a determining result is that the voltage of the fifth electrical signal does not fall within the preset range, that a drive power module is abnormal.

In addition, after determining that the low-side switch unit is enabled normally, the electrical control device detection method further includes: turning off the low-side switch unit and the first switch module, and enabling a high-side switch unit; obtaining a sixth electrical signal at the second end of the second detection module; and determining whether a level of the sixth electrical signal at the second end of the second detection module is a preset first level; determining, if a determining result is that the level of the sixth electrical signal at the second end of the second detection module is the preset first level, that the high-side switch unit is enabled normally; or determining, if a determining result is that the level of the sixth electrical signal at the second end of the second detection module is not the preset first level, that the high-side switch unit is enabled abnormally.

In addition, the "obtaining an electrical signal at a third end of a first detection module, and determining, based on the electrical signal at the third end of the first detection module, whether a fault occurs in a drive circuit of an electrical control device" specifically includes: closing a second switch module when the high-side switch unit and the low-side switch unit are in an enabled state and the first switch module is in an off state; monitoring the electrical signal at the third end of the first detection module in real time; and determining, if it is determined that a level of the electrical signal at the third end of the first detection module is not a second level, that a fault occurs in the drive circuit of the electrical control device.

BRIEF DESCRIPTION OF DRAWINGS

One or more embodiments are described exemplarily with reference to accompanying drawings corresponding to the embodiments. The exemplary description does not constitute any limitation on the embodiments. Components marked with the same reference numeral in the drawings represent similar components. Unless otherwise specified, the drawings do not constitute any scale limitation.

DETAILED DESCRIPTION OF EMBODIMENTS

Figure 1:
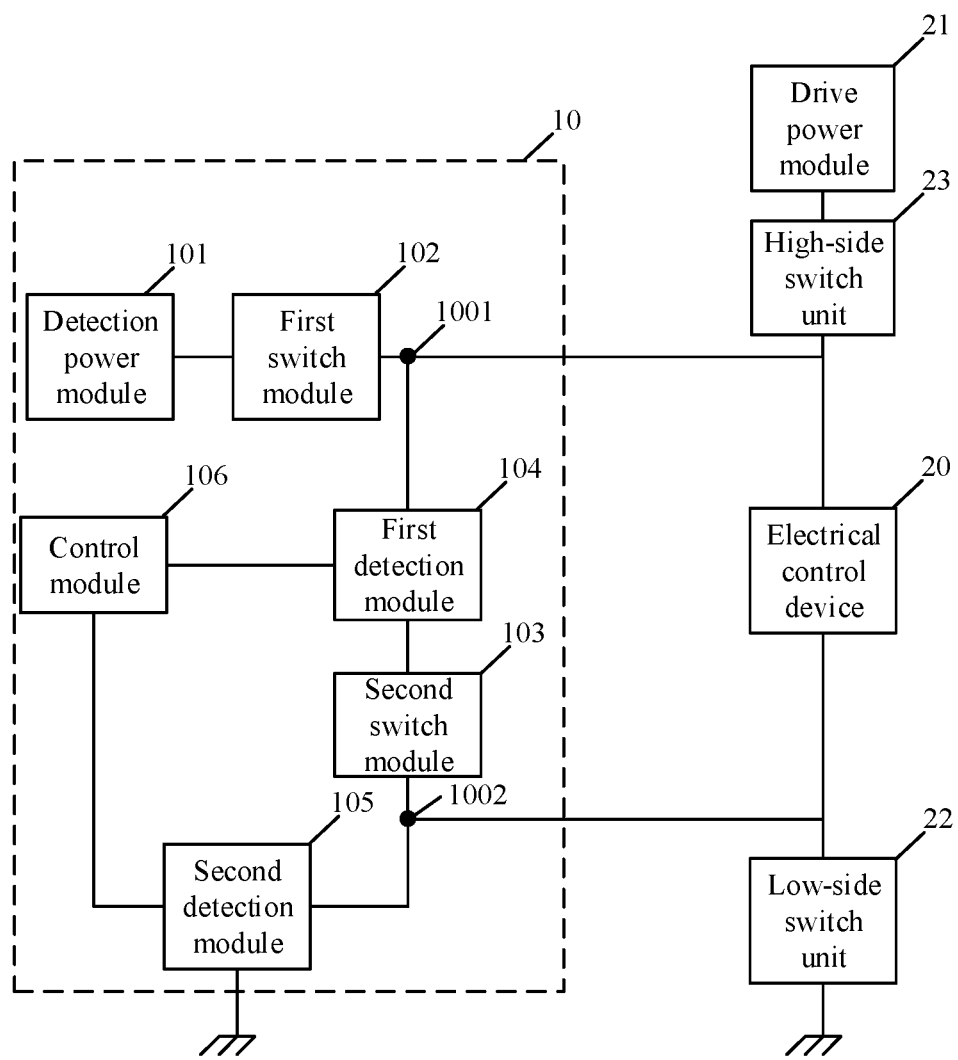
FIG. 1 is a schematic structural diagram of an electrical control device detection circuit according to a first embodiment of this application.

To make the objectives, technical solutions, and advantages of this application clearer, the following describes the embodiments of this application in detail with reference to accompanying drawings. A person of ordinary skill in the art understands that in each embodiment of this application, many technical details are provided to make readers better understand this application. However, the technical solutions claimed in this application can still be implemented based on variations and modifications of the following embodiments even without the technical details.

The reference numerals assigned to the components herein, such as "first" and "second", are merely used to distinguish the described objects but without indicating any sequential or technical meaning. Unless otherwise specified, "connection" and "concatenation" mentioned in this application include direct and indirect connections (concatenations).

As shown in FIG. 1, a first embodiment of this application relates to an electrical control device detection circuit 10. The detection circuit 10 is configured to detect a drive circuit of an electrical control device 20. The drive circuit of the electrical control device 20 includes a drive power module 21, a high-side switch unit 23, and a low-side switch unit 22. The drive power module 21 is connected to a first end of the high-side switch unit 23. A second end of the high-side switch unit 23 is connected to a first end of the electrical control device 20. A first end of the low-side switch unit 22 is connected to a second end of the electrical control device 20. A second end of the low-side switch unit 22 is grounded. As shown in FIG. 1, the detection circuit 10 includes: a detection power module 101, a first switch module 102, a second switch module 103, a first detection module 104, a second detection module 105, and a control module 106. An output end of the detection power module 101 is connected to a first end of the first switch module 102. A second end of the first switch module 102 is connected to the first end of the electrical control device 20. A first end of the first detection module 104 is connected to a first node 1001 between the second end of the first switch module 102 and the first end of the electrical control device 20. A second end of the first detection module 104 is connected to the second end of the electrical control device 20. A third end of the first detection module 104 is connected to the control module 106. A first end of the second detection module 105 is connected to a second node 1002 between the second end of the electrical control device 20 and the second end of the first detection module 104. A second end of the second detection module 105 is connected to the control module 106. A third end of the second detection module 105 is grounded. The first switch module 102 and the second switch module 103 are connected to the control module separately. The second switch module 103 is serially connected between the second end of the first detection module 104 and the second node 1002. The control module 106 is configured to obtain an electrical signal at the third end of the first detection module 104 and/or an electrical signal at the second end of the second detection module 105; and determine, based on the electrical signal at the third end of the first detection module 104 and/or the electrical signal at the second end of the second detection module 105, whether a fault occurs in the drive circuit of the electrical control device 20. When the first end of the second detection module 105 is connected to a high level, a level at the second end of the second detection module 105 is a preset first level. When the first end of the second detection module 105 is connected to a low level, the level at the second end of the second detection module 105 is a reverse level of the first level. When a current flows between the first end of the first detection module 104 and the second end of the first detection module 104, a level of an electrical signal at the third end of the first detection module 104 is a preset second level. When no current flows between the first end of the first detection module 104 and the second end of the first detection module 104, the level of the electrical signal at the third end of the first detection module 104 is a reverse level of the preset second level.

It needs to be noted that in this embodiment, the drawing shows no connection relationship between the first switch module 102 or the second switch module 103 and the control module 106. However, this does not mean that there is no connection between the control module 106 and the first switch module 102 or the second switch module 103. The control module 106 may be connected to the first switch module 102 and the second switch module 103 in a wired or wireless manner.

It needs to be noted that depending on whether the drive circuit of the electrical control device is normal or faulty, electrical conducting status differs, and the voltage at the first end of the electrical control device and/or the voltage at the second end of the electrical control device in the drive circuit differ, thereby making circuit conducting status of the first detection module and/or the second detection module different. Therefore, based on the electrical signal at the third end of the first detection module and/or the electrical signal at the second end of the second detection module, it can be determined whether a fault occurs in the drive circuit, and the fault of the drive circuit of the electrical control device can be detected.

As an example, a current output by the detection power module 101 is less than an operating current of the electrical control device. The operating current means a minimum current that causes the electrical control device to operate. When no electrical signal is detected at the first end of the second detection module 105 or a low-level signal is detected, the level of the electrical signal output by the second end of the second detection module 105 is not the preset first level. When an electrical signal is detected at the first end of the second detection module 105, the level of the electrical signal output by the second end of the second detection module 105 is the preset first level. When a current flows between the first end of the first detection module 104 and the second end of the first detection module 104, the level of the electrical signal output by the third end of the first detection module 104 is the preset second level. When no current flows between the first end of the first detection module 104 and the second end of the first detection module 104, the electrical signal output by the third end of the first detection module 104 is a reverse-level signal with the preset second level. The current output by the detection power module 101 is less than the operating current of the electrical control device. Therefore, after the first switch module 102 is closed, the electrical control device 20 is still in a disabled state. After the first switch module 102 is closed and the second switch module 103 is turned off, if no fault occurs in the drive circuit, an electrically conductive path exists between the detection power module 101 and the first end of the second detection module 105, and the level of the electrical signal at the second end of the second detection module 105 is the preset first level. If a fault occurs in the drive circuit, no electrically conductive path can be formed between the detection power module 101 and the second detection module 105, and the level of the electrical signal at the second end of the second detection module 105 is not the preset first level. Therefore, when the level of the electrical signal at the second end of the second detection module 105 is not the preset first level, the control module 106 determines that a fault exists in the drive circuit. In some embodiments, after determining that a fault occurs in the drive circuit, the control module 106 closes the second switch module 103 to further determine the fault type of the drive circuit. When an open-circuit fault exists in the drive circuit, the current output by the detection power module 101 passes through the first detection module 104. If a shorted-to-ground fault exists in the drive circuit, an impedance of the detection power module 101 to the ground is close to 0, and therefore, the current output by the detection power module 101 will not pass through the first detection module 104. Therefore, the electrical signal at the third end of the first detection module 104 differs depending on the type of fault occurring in the drive circuit.

As can be seen from above, depending on whether an open-circuit fault or a shorted-to-ground fault occurs in the drive circuit, the electrical signal at the third end of the first detection module 104 differs. The control module 106 can determine the fault type of the drive circuit based on the electrical signal at the third end of the first detection module 104.

It needs to be noted that, a person skilled in the art understands that the first level may be a high level or a low level. In practical applications, the level may be determined based on the device type and circuit structure selected for each module in the detection circuit. For example, when the drive circuit is normal, the electrical signal at the second end of the second detection module 105 is a low-level signal, and the first level is a low level; and, when a fault occurs in the drive circuit, the electrical signal at the second end of the second detection module 105 is a high-level signal, and the first level is a high level.

Figure 2:
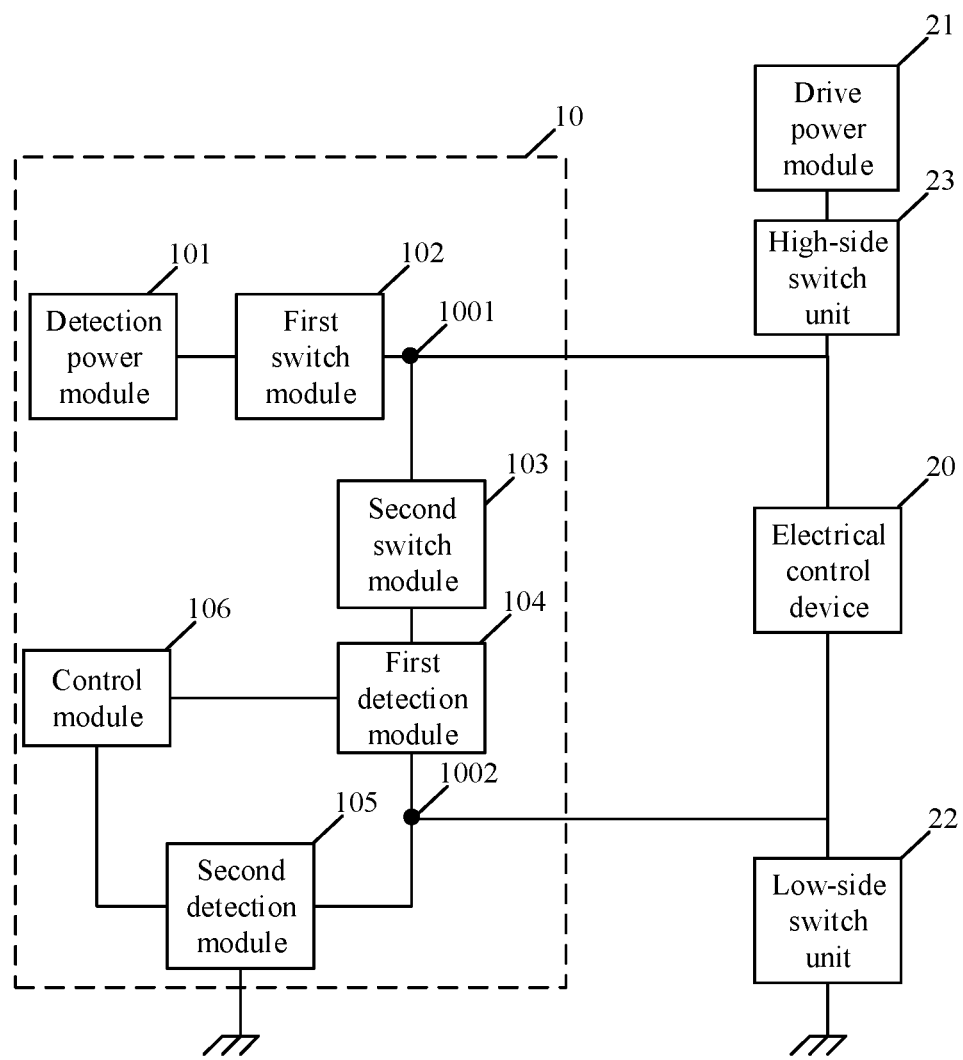
FIG. 2 is a schematic structural diagram of another electrical control device detection circuit according to a first embodiment of this application.

It needs to be noted that a person skilled in the art understands that in this embodiment, for clarity, the second switch module 103 is serially connected between the second end of the first detection module 104 and the second node 1002. In practical applications, the second switch module 103 may be serially connected between the first end of the first detection module 104 and the first node 1001. In this case, a schematic structural diagram of the detection circuit is shown in FIG. 2. This embodiment does not limit the location of the second switch module 103.

It needs to be noted that the electrical control device may be a relay or another device that uses a low current to control the status thereof. This embodiment does not limit the specific type of the electrical control device.

It needs to be noted that the foregoing description is merely exemplary, but does not constitute any limitation on the technical solutions of this application.

In contrast with the prior art, in the electrical control device detection circuit according to this embodiment, depending on whether the drive circuit of the electrical control device is normal or faulty, electrical conducting status differs, and the voltage at the first end of the electrical control device and/or the voltage at the second end of the electrical control device in the drive circuit differ. Therefore, whether a fault occurs in the drive circuit can be determined by detecting the voltage at the first end of the electrical control device and/or the voltage at the second end of the electrical control device, and the fault of the drive circuit of the electrical control device can be detected. For example, whether a fault occurs in the drive circuit can be determined by detecting an electrical signal at the third end of the first detection module and/or an electrical signal at the second end of the second detection module, and the fault of the drive circuit of the electrical control device can be detected. Therefore, the control module may obtain the electrical signal at the third end of the first detection module, and determine, based on the electrical signal at the third end of the first detection module, whether the drive circuit of the electrical control device is faulty; or, obtain the electrical signal at the second end of the second detection module, and determine, based on the electrical signal at the second end of the second detection module, a fault type of the drive circuit of the electrical control device; or, obtain the electrical signal at the third end of the first detection module and the electrical signal at the second end of the second detection module, and determine, based on the electrical signal at the third end of the first detection module and the electrical signal at the second end of the second detection module, whether a fault occurs in the drive circuit of the electrical control device, thereby fulfilling the objectives of performing fault detection on the drive circuit of the electrical control device and determining the fault type.

A second embodiment of this application relates to an electrical control device detection circuit. The second embodiment exemplifies the circuit structure of the first detection module 104 mentioned in the first embodiment. The content that has been described in the first embodiment will be omitted here.

Figure 3:
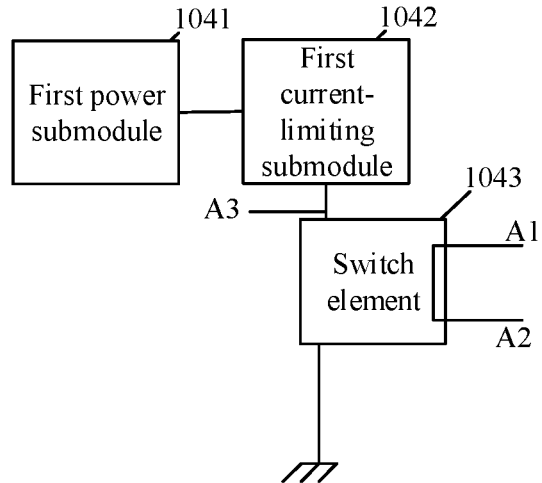
FIG. 3 is a schematic structural diagram of a first detection module according to a second embodiment of this application.

Specifically, as shown in FIG. 3, in this embodiment, the first detection module 104 includes a first power submodule 1041, a first current-limiting submodule 1042, and a switch element 1043. A first end of the switch element 1043 serves as the first end A1 of the first detection module 104. A second end of the switch element 1043 serves as the second end A2 of the first detection module 104. A third end of the switch element 1043 is connected to the first power submodule 1041 by the first current-limiting submodule 1042. A fourth end of the switch element 1043 is grounded. The third end of the switch element 1043 serves as the third end A3 of the first detection module 104. The second level is a low level. When a current flows from the first end of the switch element 1043 to the second end of the switch element 1043, an electrically conductive path is formed between the third end of the switch element 1043 and the fourth end of the switch element 1043. The first current-limiting submodule 1012 may include one or more resistors.

It needs to be noted that FIG. 3 exemplifies the structure of the first detection module 104 by giving an example in which the first current-limiting submodule 1042 is serial-connected between the third end of the switch element 1043 and the first power submodule 1041. In practical applications, another connection relationship between the first current-limiting submodule 1042, the first power submodule 1041, and the switch element 1043 may be: the third end of the switch element 1043 is connected to the first power submodule 1041, and the fourth end of the switch element 1043 is connected to the first end of the first current-limiting submodule 1042, the second end of the first current-limiting submodule is grounded, and the first end of the first current-limiting submodule serves as the third end A3 of the first detection module. The second level is a high level. This embodiment does not limit the connection relationship between the first current-limiting submodule 1042, the first power submodule 1041, and the switch element 1043.

As an example, the detection circuit further includes a filter module. The third end of the first detection module 104 is connected to the control module by the filter module. For example, the third end of the first detection module 104 is connected to a first end of the filter module, a second end of the filter module is grounded, and a third end of the filter module is connected to the control module.

It needs to be noted that, by being connected to the control module through the filter module, the third end of the first detection module can ensure high stability of a detection signal at the third end of the first detection module.

As an example, the filter module includes a capacitor.

It needs to be noted that, a person skilled in the art understands that the filter module may adopt another circuit structure. For example, a first-order resistor-capacitor (RC) filter circuit structure may be selected. This embodiment does not limit the specific circuit structure of the filter module.

The following exemplifies a detection method of the first detection module with reference to FIG. 3 that serves as an example. In a case that the second switch module 103 is closed, when an open-circuit fault occurs in the drive circuit, the current output by the detection power module 101 flows through the first end of the switch element 1043 and the second end of the switch element 1043. An electrically conductive path is formed between the third end of the switch element 1043 and the fourth end of the switch element 1043. Therefore, the level of the electrical signal at the third end of the switch element 1043 is the preset second level. That is, the level of the electrical signal at the third end of the first detection module 104 is the second level. When a shorted-to-ground fault occurs in the drive circuit, an output end of the detection power module 101 is equivalent to connecting to the ground, and no current flows between the first end of the switch element 1043 and the second end of the switch element 1043, and no electrically conductive path can be formed between the third end of the switch element 1043 and the fourth end of the switch element 1043. Therefore, the level of the electrical signal at the third end of the switch element 1043 is not the second level, that is, the level of the electrical signal at the third end of the first detection module 104 is not the second level. Therefore, the control module 106 can determine the fault type of the drive circuit based on the electrical signal at the third end of the first detection module 104.

As an example, the switch element is any one of a photocoupler, a relay, a reed switch, or an optical field effect transistor.

As an example, the detection circuit further includes a first current-limiting module. The first end of the first detection module is connected to the first node by the first current-limiting module.

It needs to be noted that the first current-limiting module added in the first detection module can avoid problems such as damage to the control module caused by a too high potential or current of the electrical signal output by the fourth end of the switch element.

Figure 4:
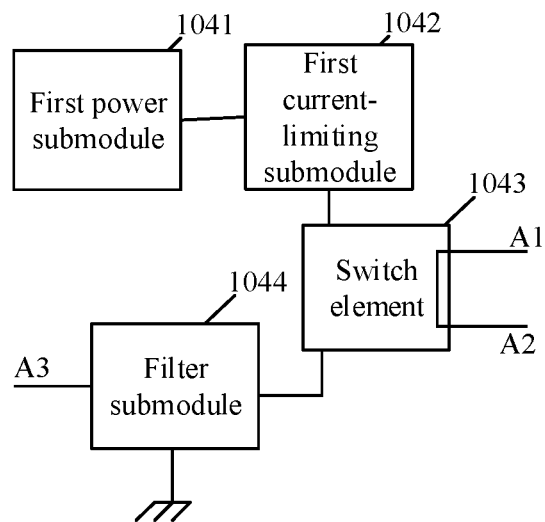
FIG. 4 is another schematic structural diagram of a first detection module according to a second embodiment of this application.

It needs to be noted that, a person skilled in the art understands that in practical applications, the first detection module 104 may adopt another form of structure. For example, as shown in FIG. 4, the first detection module 104 includes: a first power submodule 1041, a filter submodule 1044, a first current-limiting submodule 1042, and a switch element 1043. A first end of the switch element 1043 serves as the first end A1 of the first detection module 104. A second end of the switch element 1043 serves as the second end A2 of the first detection module 104. A third end of the switch element 1043 is connected to the first power submodule 1041 by the first current-limiting submodule 1042. A fourth end of the switch element 1043 is connected to a first end of the filter submodule 1044. A second end of the filter submodule 1044 is grounded. A third end of the filter submodule 1044 serves as the third end A3 of the first detection module. The second level is a high level. The filter submodule 1044 may be a capacitor. A first end of the capacitor serves as the first end and the third end of the filter submodule, and a second end of the capacitor serves as the second end of the filter submodule. The filter submodule 1044 may adopt an RC filter structure or the like.

In contrast with the prior art, in the electrical control device detection circuit provided in this embodiment, depending on whether an open-circuit fault or a shorted-to-ground fault occurs in the drive circuit, connection status between the third end of the switch element and the fourth end of the switch element differs, thereby making the electrical signal at the third end of the first detection module different. Therefore, the control module can determine the fault type based on the electrical signal at the third end of the first detection module.

A third embodiment of this application relates to an electrical control device detection circuit. This embodiment exemplifies the circuit structure of the second detection module 105 mentioned in the first embodiment. The content that has been described in the first embodiment is omitted here.

Figure 5:
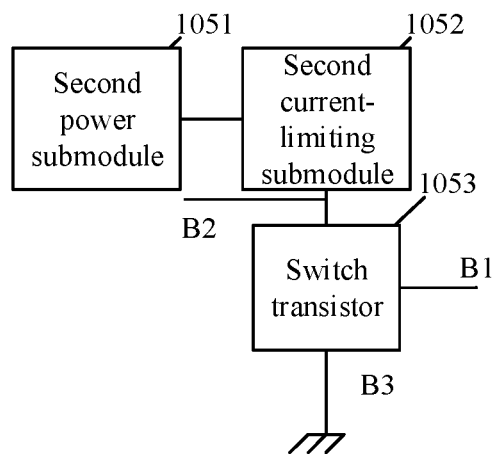
FIG. 5 is a schematic structural diagram of a second detection module according to a third embodiment of this application.

Specifically, as shown in FIG. 5, in this embodiment, the second detection module 105 includes a second power submodule 1051, a second current-limiting submodule 1052, and a switch transistor 1053. The second power submodule 1051 is connected to a first end of the switch transistor 1053 by the second current-limiting submodule 1052. A control end of the switch transistor 1053 serves as a first end B1 of the second detection module. The first end of the switch transistor 1053 serves as a second end B2 of the second detection module. A second end of the switch transistor 1053 serves as a third end B3 of the second detection module.

Specifically, the status of the switch transistor 1053 changes depending on a voltage value of an electrical signal input into the control end of the switch transistor 1053. Therefore, when the first end and the second end of the switch transistor 1053 are conducted, the first end of the switch transistor 1053 carries a low-level signal; and, when the first end and the second end of the switch transistor 1053 are not conducted, the first end of the switch transistor 1053 carries a high-level signal. Depending on whether the drive circuit of the electrical control device 20 is normal or the drive circuit of the electrical control device 20 is faulty, the electrical signal received at the control end of the switch transistor 1053 differs, thereby making the electrical signal at the first end of the switch transistor 1053 different.

It is assumed that the switch transistor is an N-type transistor and the preset first level is a low level. After the first switch module 102 is closed, if the first end of the switch transistor carries a low-level signal, it means that the first end and the second end of the switch transistor are conducted, that is, the drive circuit of the electrical control device is normal. If the first end of the switch transistor carries a high-level signal, it means that the first end and the second end of the switch transistor are not conducted, that is, a fault occurs in the drive circuit of the electrical control device.

In some embodiments, the control module may further determine the fault type based on a detection result of the first detection module.

As an example, the detection circuit further includes a second current-limiting module. The second end B2 of the second detection module 105 is connected to the control module 106 by the second current-limiting module.

It needs to be noted that the second current-limiting module added in the detection circuit can avoid problems such as damage to the control module caused by a too high electrical signal output by the second end of the second detection module.

In contrast with the prior art, in the electrical control device detection circuit according to this embodiment, depending on whether the drive circuit is normal or faulty, the electrical signal at the control end of the switch transistor differs, thereby making the status of the switch transistor different, and further making the electrical signal at the first end of the switch transistor different. Therefore, based on the electrical signal at the first end of the switch transistor, the control module can determine whether a fault occurs in the drive circuit.

A fourth embodiment of this application relates to an electrical control device detection circuit. This embodiment exemplifies the circuit structure of the detection power module 101 mentioned in the first embodiment. The content that has been described in the first embodiment is omitted here.

Figure 6:
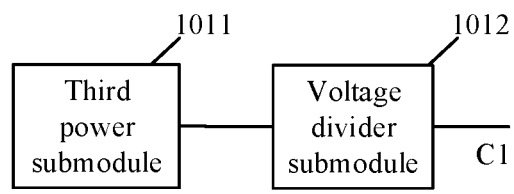
FIG. 6 is a schematic structural diagram of a detection power module according to a fourth embodiment of this application.

Specifically, as shown in FIG. 6, in this embodiment, the detection power module 101 includes a third power submodule 1011 and a voltage divider submodule 1012. The third power submodule 1011 is connected to a first end of the voltage divider submodule 1012. A second end of the voltage divider submodule 1012 serves as an output end C1 of the detection power module 101.

In an example, the voltage divider submodule 1012 includes one or more resistors.

It needs to be noted that, a person skilled in the art understands that an impedance value of the voltage divider submodule 1012 may be determined based on the voltage output by the third power submodule 1011 and an operating current of the electrical control device. This is not limited herein.

Figure 7:
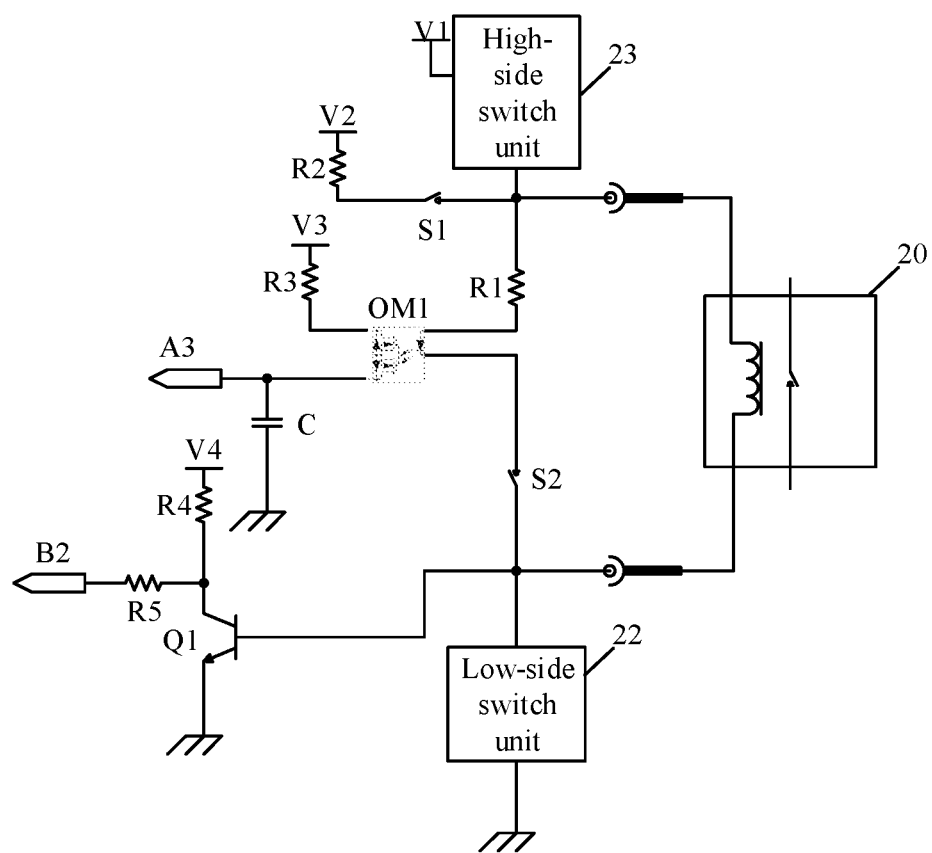
FIG. 7 is a circuit diagram of a drive circuit and a detection circuit of an electrical control device according to a fourth embodiment of this application.

In an example, the electrical control device 20 is a relay, the first detection module adopts a structure shown in FIG. 4, the second detection module adopts a structure enumerated in the third embodiment, the detection power module adopts a structure enumerated in the fourth embodiment, and circuit diagrams of the drive circuit and the detection circuit of the electrical control device are shown in FIG. 7. In FIG. 7, V1 represents a drive power module of the drive circuit, V2 represents a third power submodule in the detection power module, R2 represents a voltage divider submodule, S1 represents a first switch module, S2 represents a second switch module, R1 represents a first current-limiting module, V3 represents a first power submodule, R3 represents a first current-limiting submodule, OW represents a switch element, C represents a filter submodule, A3 represents a third end of the first detection module, V4 represents a second power submodule, R4 represents a second current-limiting submodule, B2 represents a second end of the second detection module, R5 represents a second current-limiting module, and Q1 represents a switch transistor. The first level is a low level, and the second level is a high level. In contrast with the prior art, in the electrical control device detection circuit provided in this embodiment, a voltage divider submodule is serial-connected in the detection power module, and the current output by the detection power module is less than the operating current of the electrical control device. In this way, the detection circuit can implement the fault detection on the drive circuit of the electrical control device when the electrical control device is in a disabled state.

A fifth embodiment of this application relates to an electrical control device detection circuit. This embodiment is a further improvement of the first embodiment. The specific improvement is: a freewheeling module 107 is added in the detection circuit. The content that has been described in the first embodiment is omitted here.

Figure 8:
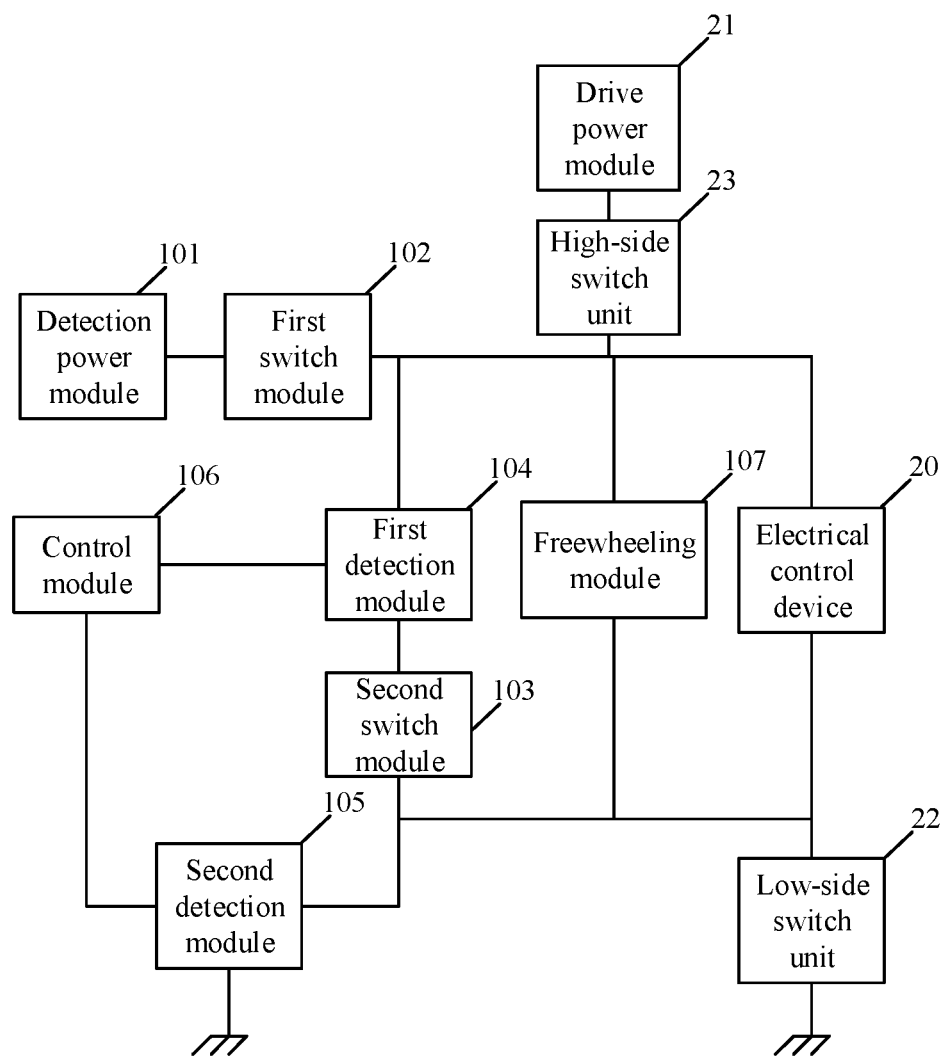
FIG. 8 is a schematic structural diagram of an electrical control device detection circuit according to a fifth embodiment of this application.

Specifically, as shown in FIG. 8, the freewheeling module 107 is parallel-connected to the electrical control device 20.

Figure 9:
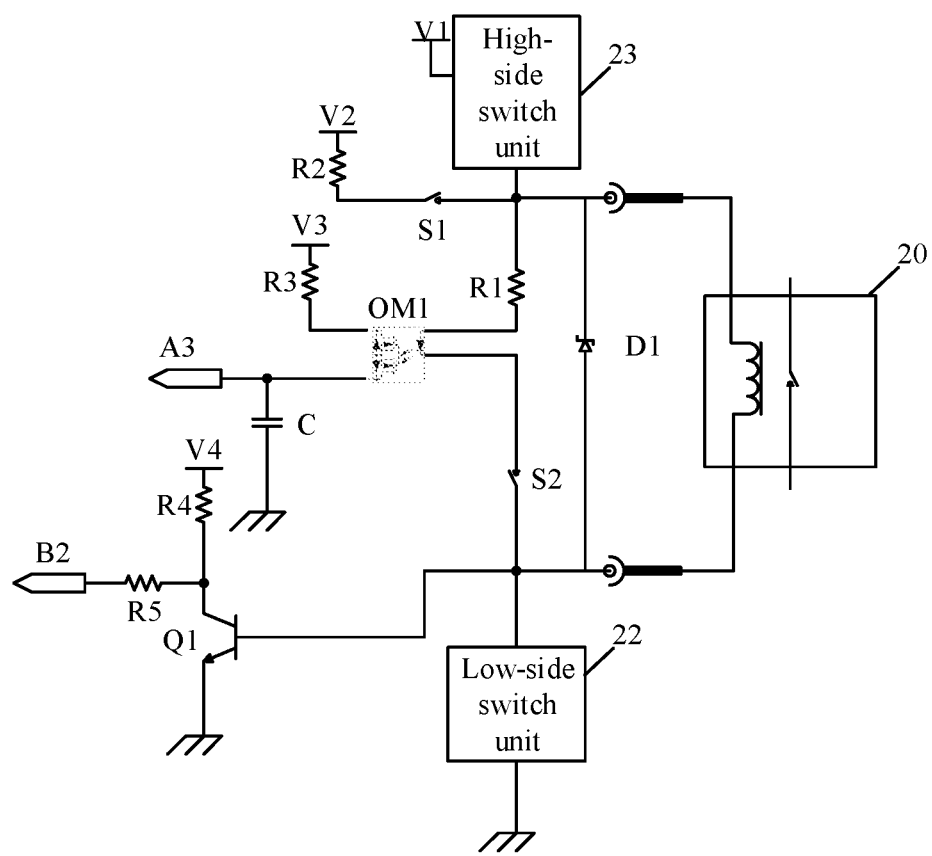
FIG. 9 is a circuit diagram of a drive circuit and a detection circuit of an electrical control device according to a fifth embodiment of this application.

As an example, the freewheeling module 107 is a transient voltage suppression diode, and the circuit diagrams of the drive circuit and the detection circuit of the electrical control device are shown in FIG. 9. In FIG. 9, D1 represents a transient voltage suppression diode, V1 represents a drive power supply of the drive circuit, V2 represents a third power submodule in the detection power module, R2 represents a voltage divider submodule, S1 represents a first switch module, S2 represents a second switch module, R1 represents a first current-limiting module, V3 represents a first power submodule, R3 represents a first current-limiting submodule, OM1 represents a switch element, C represents a filter submodule, A3 represents a third end of the first detection module, V4 represents a second power submodule, R4 represents a second current-limiting submodule, B2 represents a second end of the second detection module, R5 represents a second current-limiting module, and Q1 represents a switch transistor. In contrast with the prior art, in the electrical control device detection circuit provided in this embodiment, the freewheeling module is parallel-connected to the electrical control device. When the current flowing in the electrical control device disappears, an induced electromotive force generated by the electrical control device is consumed by work done in a loop formed by the freewheeling module and the electrical control device, thereby protecting safety of other devices in the circuit. A sixth embodiment of this application relates to an electrical control device detection circuit. This embodiment is a further improvement of the first embodiment. The specific improvement is: a third detection module is added in the detection circuit. The content that has been described in the first embodiment is omitted here.

Figure 10:
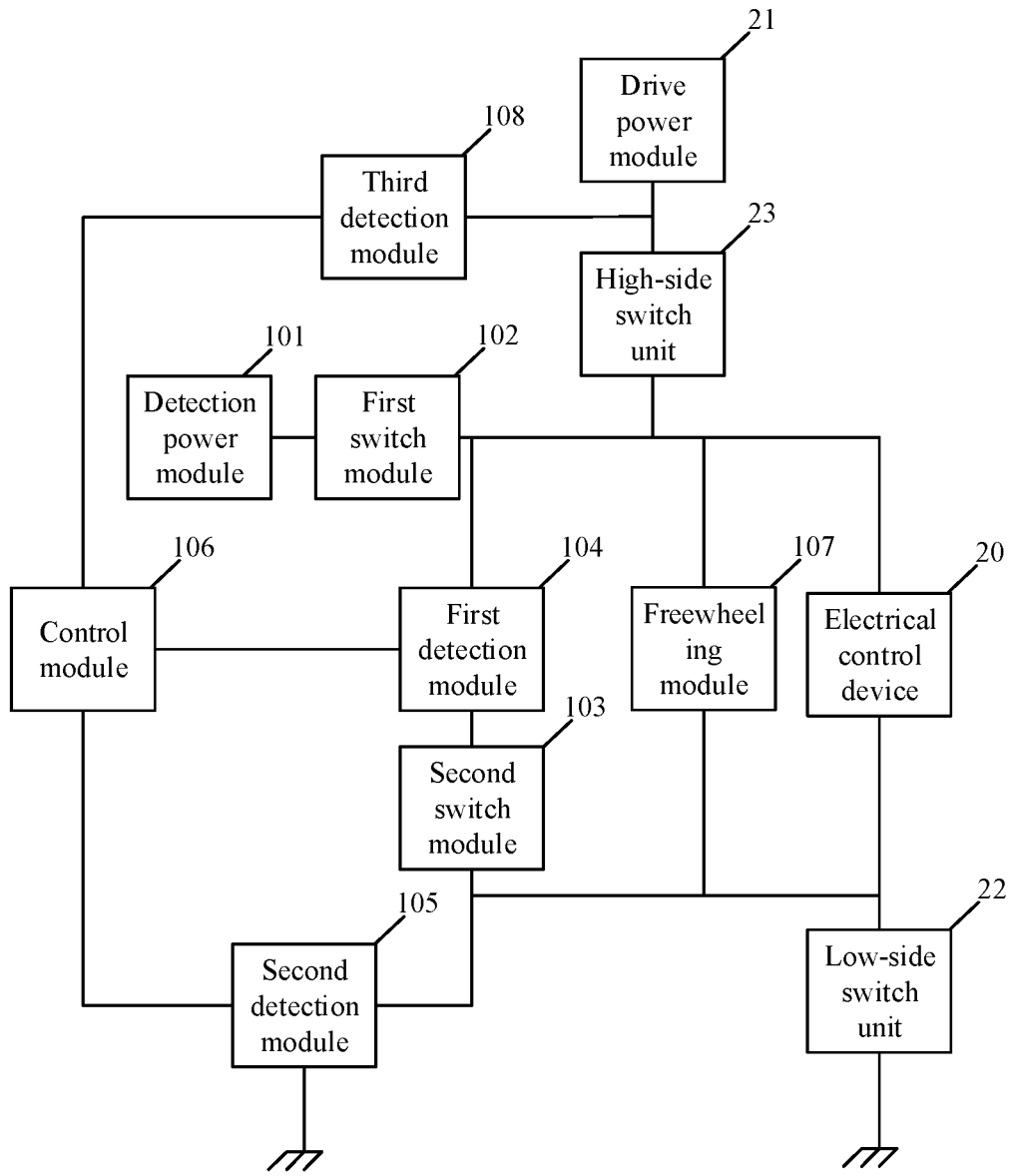
FIG. 10 is a schematic structural diagram of an electrical control device detection circuit according to a sixth embodiment of this application.

Specifically, as shown in FIG. 10, a first end of the third detection module 108 is connected to the first end of the high-side switch unit 23. A second end of the third detection module 108 is connected to the control module 106. The control module 106 is further configured to determine, based on an electrical signal at the second end of the third detection module 108, whether a fault occurs in the drive power module 21.

Specifically, if a fault occurs in the drive power module 21, no electrical signal exists at a node between the drive power module 21 and the high-side switch unit 23. Therefore, the third detection module 108 may detect the node between the drive power module 21 and the high-side switch unit 23 to determine whether a fault occurs in the drive power module 21.

Figure 11:
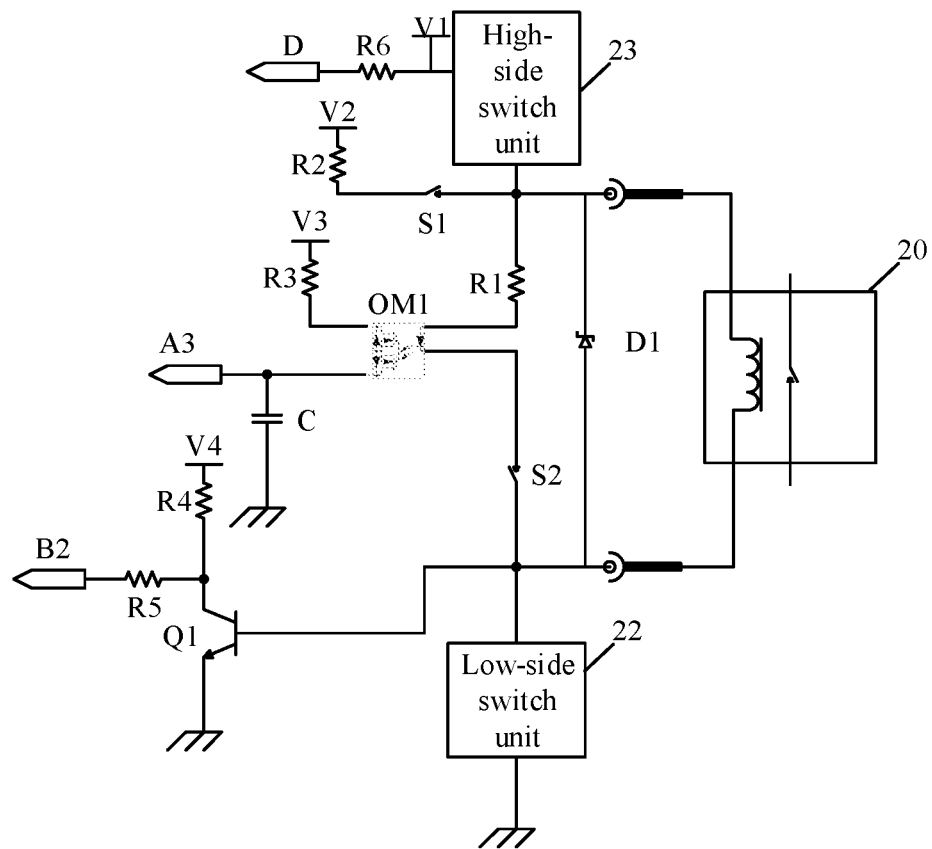
FIG. 11 is a circuit diagram of a drive circuit and a detection circuit of an electrical control device according to a sixth embodiment of this application.

In an example, the third detection module 108 includes resistors. FIG. 11 shows a circuit diagram of a drive circuit and a detection circuit of an electrical control device. In FIG. 11, R6 represents a third detection module, D represents a second end of the third detection module, D1 represents a transient voltage suppression diode, V1 represents a drive power of the drive circuit, V2 represents a third power submodule in the detection power module 101, R2 represents a voltage divider submodule, S1 represents a first switch module 102, S2 represents a second switch module 103, R1 represents a first current-limiting module, V3 represents a first power submodule, R3 represents a first current-limiting submodule, OM1 represents a switch element, C represents a filter submodule, A3 represents a third end of the first detection module, V4 represents a second power submodule, R4 represents a second current-limiting submodule, B2 represents a second end of the second detection module, R5 represents a second current-limiting module, and Q1 represents a switch transistor.

It needs to be noted that, a person skilled in the art understands that FIG. 11 is merely exemplary. In practical applications, each module may adopt another circuit structure that serves a similar function. This embodiment does not limit the form of the specific circuit structure of each module.

In contrast with the prior art, the electrical control device detection circuit provided in this embodiment can determine, based on the electrical signal at the second end of the third detection module when the electrical control device is disabled, whether a fault occurs in the drive power in the drive circuit, thereby further improving the fault detection on the drive circuit of the electrical control device.

A seventh embodiment of this application relates to an electrical control device detection circuit. This embodiment exemplifies a structure of the control module.

Figure 12:
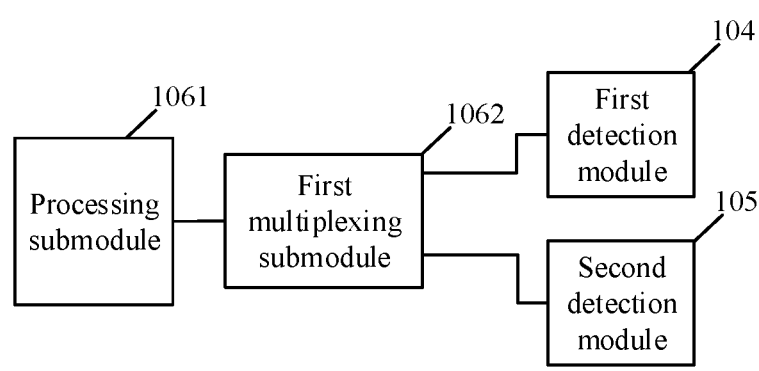
FIG. 12 is a schematic structural diagram of an electrical control device detection circuit according to a seventh embodiment of this application.

Specifically, as shown in FIG. 12, the control module 106 includes a processing submodule 1061 and a first multiplexing submodule 1062. The processing submodule 1061 is connected to the third end of the first detection module 104 and the second end of the second detection module 105 by the first multiplexing submodule 1062.

Figure 13:
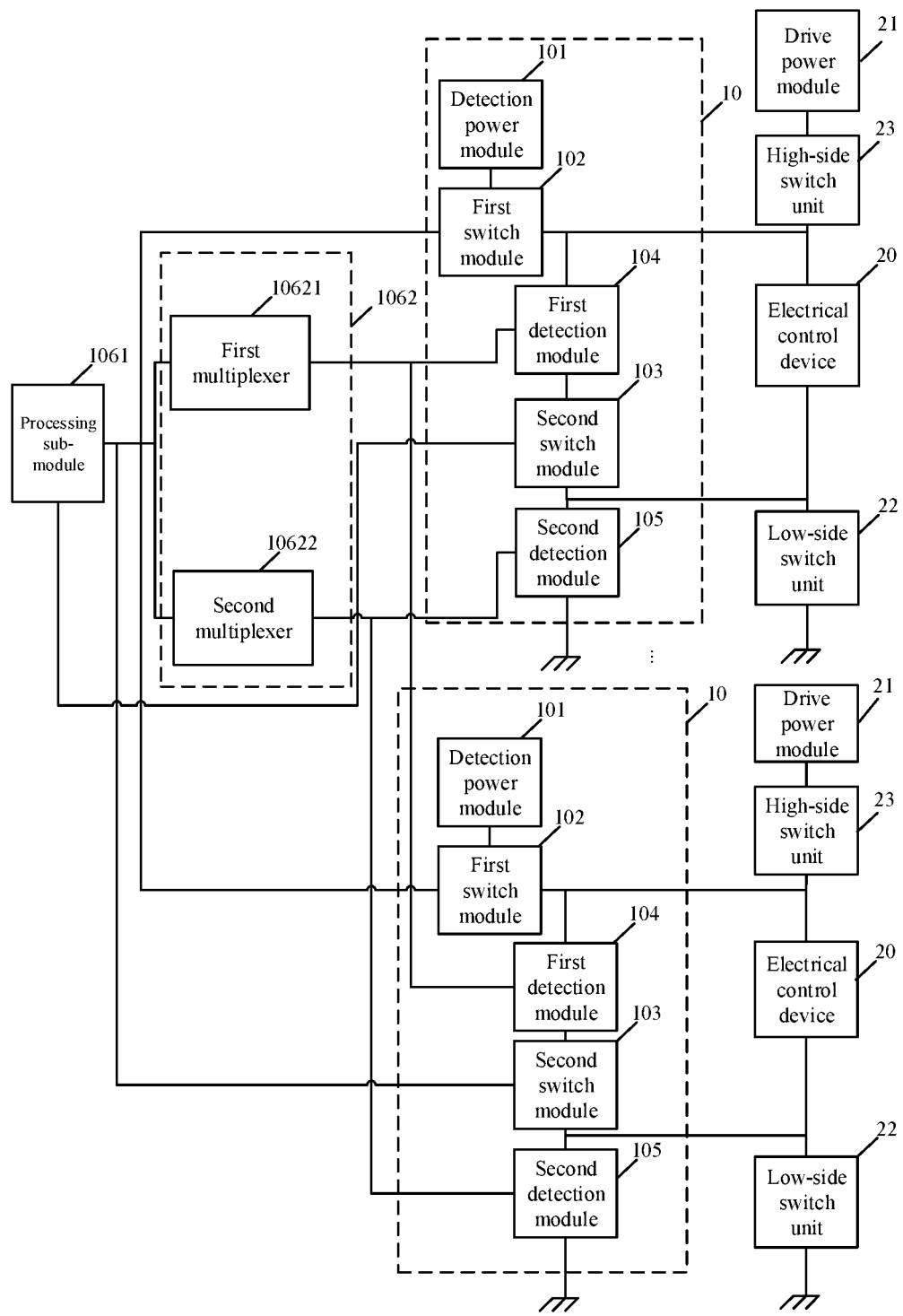
FIG. 13 is a schematic structural diagram of a detection circuit and a drive circuit of an electrical control device according to a seventh embodiment of this application.

As an example, as shown in FIG. 13, the first multiplexing submodule 1062 includes a plurality of multiplexers. For example, the first multiplexing submodule 1062 includes a first multiplexer 10621 and a second multiplexer 10622. The processing submodule 1061 is connected to the third end of the first detection module 104 by the first multiplexer 10621. The processing submodule 1061 is connected to the second end of the second detection module 105 by the second multiplexer 10622.

It needs to be noted that the processing submodule 1061 is connected to the first detection module 104 and the second detection module 105 by the multiplexing submodule to implement a "one-to-many" detection function of a processor port, thereby reducing the required quantity of ports of the processing submodule. In this way, one processing submodule can be connected to more first detection modules 104 and second detection modules 105.

A seventh embodiment of this application relates to an electrical control device detection circuit. This embodiment exemplifies a structure of the control module.

Figure 14:
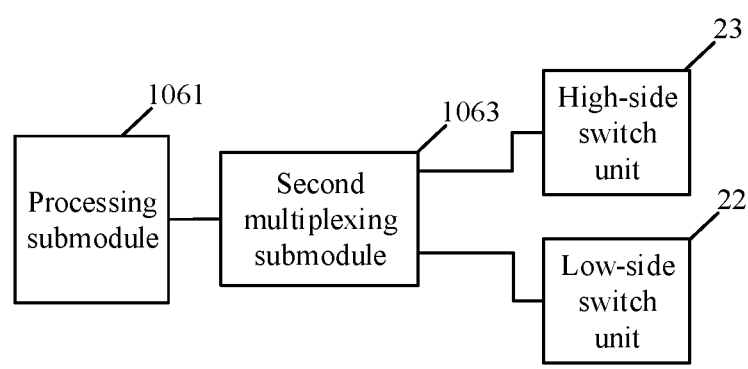
FIG. 14 is a schematic connection diagram of a control module, a high-side switch unit, and a low-side switch unit according to an eighth embodiment of this application.

Specifically, as shown in FIG. 14, the control module 106 includes a processing submodule 1061 and a second multiplexing submodule 1063. The processing submodule 1061 is connected to the high-side switch unit 23 and the low-side switch unit 22 by the second multiplexing submodule 1063.

Figure 15:
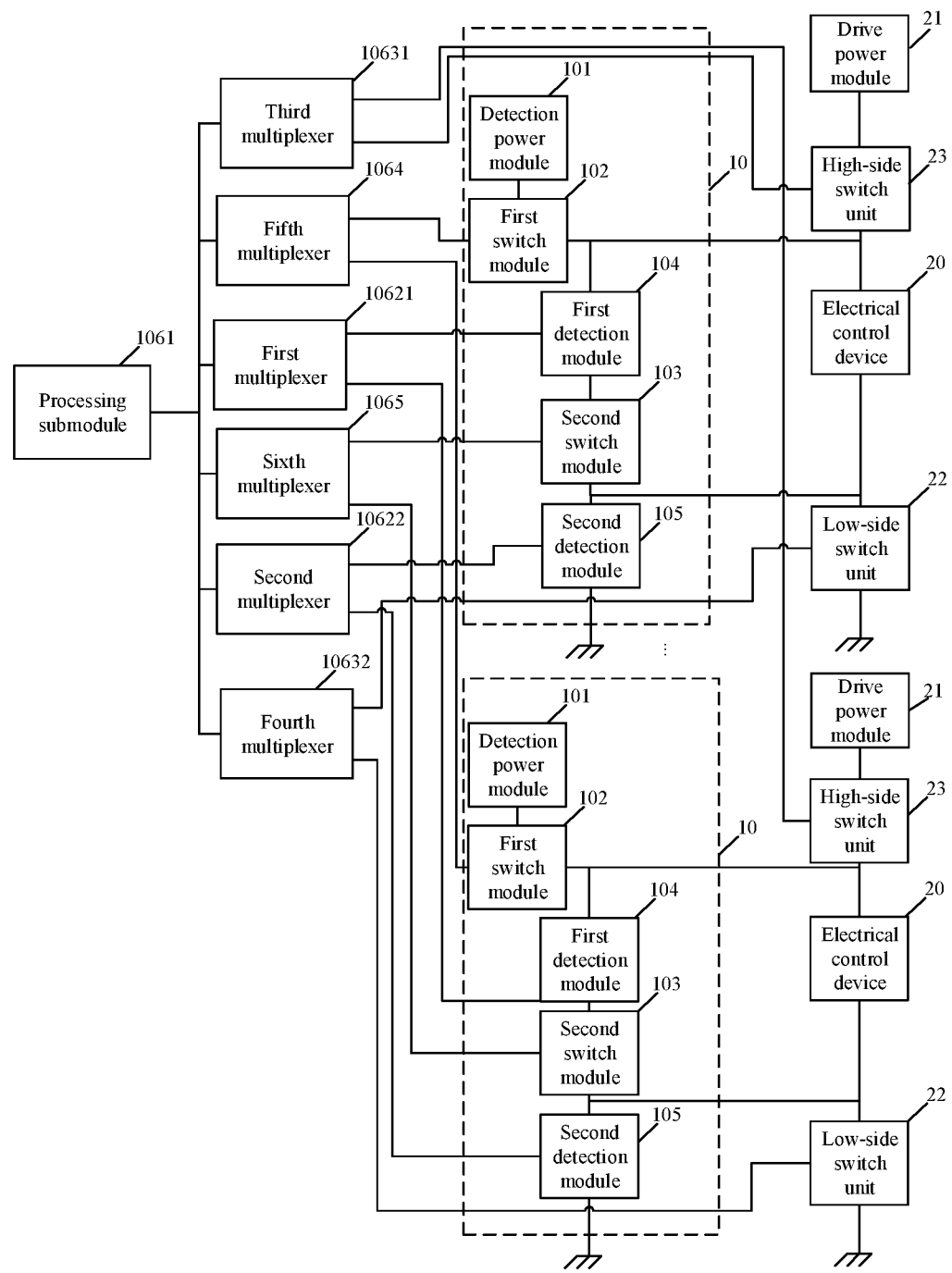
FIG. 15 is a schematic structural diagram of a detection circuit and a drive circuit of an electrical control device according to an eighth embodiment of this application.

As an example, as shown in FIG. 15, the second multiplexing submodule 1063 includes a third multiplexer 10631 and a fourth multiplexer 10632. The processing submodule 1061 is connected to the high-side switch unit 23 of the electrical control device 20 by the third multiplexer 10631. The processing submodule 1061 is connected to the low-side switch unit 22 of the electrical control device 20 by the fourth multiplexer 10632. In some embodiments, the processing submodule 1061 is connected to the first switch module 102 by a fifth multiplexer 1064. The processing submodule 1061 is connected to the second switch module 103 by a sixth multiplexer 1065.

It needs to be noted that the processing submodule is connected to the high-side switch unit and the low-side switch unit in a "one-to-many" connection mode, thereby further reducing the required quantity of ports of the processing submodule.

Figure 16:
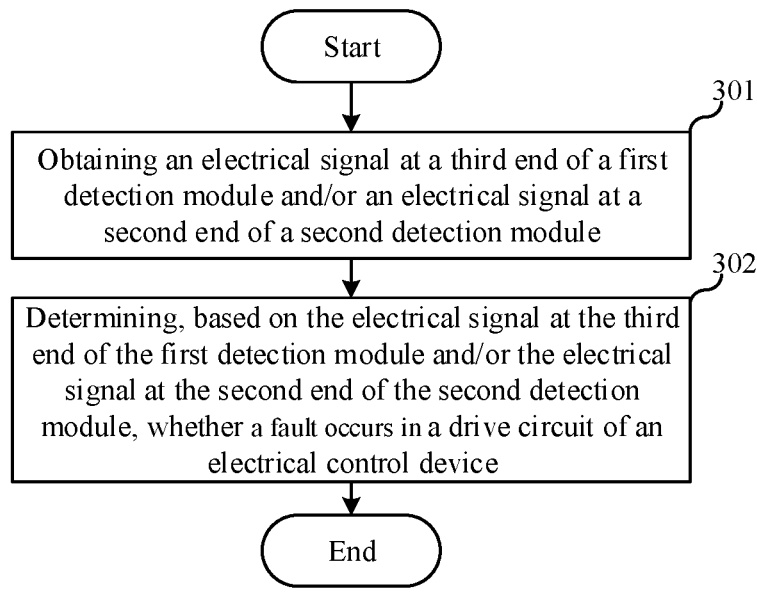
FIG. 16 is a flowchart of an electrical control device detection method according to a ninth embodiment of this application.

A ninth embodiment of this application relates to an electrical control device detection method, applied to the control module in the electrical control device detection circuit according to any of the first to seventh embodiments. As shown in FIG. 16, the electrical control device detection method includes the following steps:

When the low-side switch unit in the drive circuit of the electrical control device is disabled, the following steps are performed:

Step 301: Obtaining an electrical signal at a third end of a first detection module and/or an electrical signal at a second end of a second detection module; and Specifically, the control module is connected to the third end of the first detection module and the second end of the second detection module separately, and can obtain the electrical signal at the third end of the first detection module and/or the electrical signal at the second end of the second detection module.

Step 302: Determining, based on the electrical signal at the third end of the first detection module and/or the electrical signal at the second end of the second detection module, whether a fault occurs in a drive circuit of an electrical control device.

In this embodiment of this application, the detection method may specifically include:

obtaining an electrical signal at the third end of the first detection module, and determining, based on the electrical signal at the third end of the first detection module, whether a fault occurs in the drive circuit of the electrical control device; or obtaining an electrical signal at the second end of the second detection module, and determining, based on the electrical signal at the second end of the second detection module, whether a fault occurs in the drive circuit of the electrical control device; or obtaining an electrical signal at the third end of the first detection module and an electrical signal at the second end of the second detection module, and determining, based on the electrical signal at the third end of the first detection module and the electrical signal at the second end of the second detection module, whether a fault occurs in the drive circuit of the electrical control device.

Specifically, depending on whether the drive circuit of the electrical control device is normal or faulty, electrical conducting status differs, and the voltage at the first end of the electrical control device and/or the voltage at the second end of the electrical control device in the drive circuit differ, thereby making circuit conducting status of the first detection module and/or the second detection module different. Therefore, based on the electrical signal at the third end of the first detection module and/or the electrical signal at the second end of the second detection module, it can be determined whether a fault occurs in the drive circuit, and the fault of the drive circuit of the electrical control device can be detected.

Evidently, this embodiment is a method embodiment corresponding to the first to seventh embodiments, and this embodiment may be implemented in coordination with the first to seventh embodiments. Relevant technical details mentioned in the first to seventh embodiments are still applicable to this embodiment. For brevity, the details are omitted here. Correspondingly, the relevant technical details mentioned in this embodiment are applicable in the first to seventh embodiments.

A tenth embodiment of this application relates to an electrical control device detection method. This embodiment exemplifies a process mentioned in the ninth embodiment, that is, a process by which the control module determines, based on the electrical signal at the third end of the first detection module and the electrical signal at the second end of the second detection module, whether a fault occurs in the drive circuit of the electrical control device.

Figure 17:
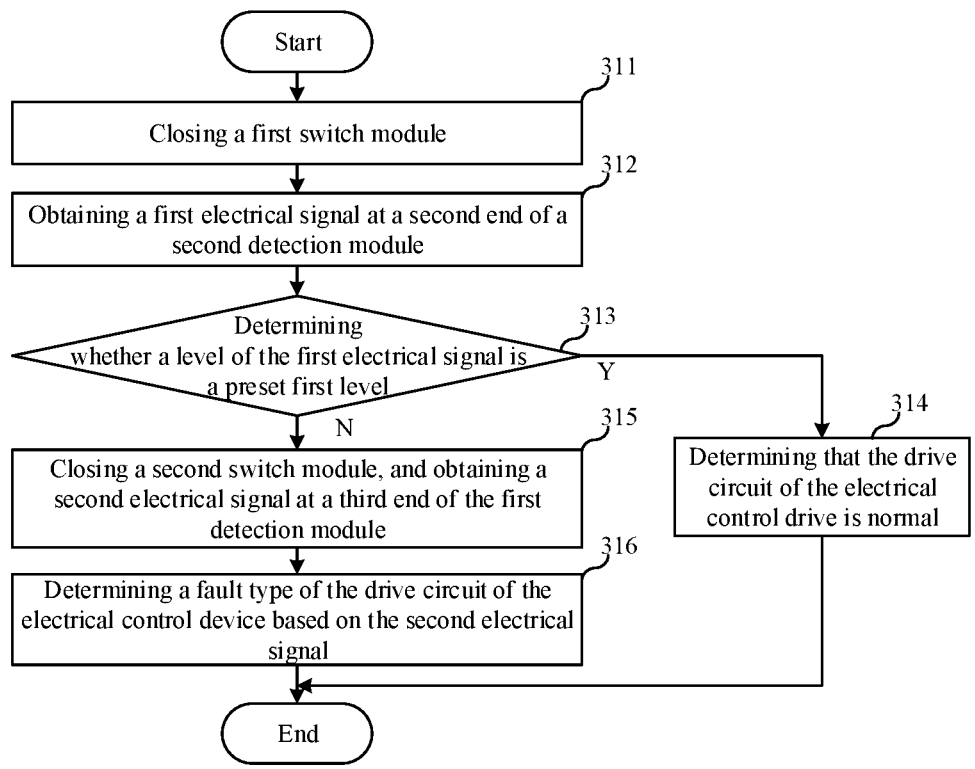
FIG. 17 is a flowchart of an electrical control device detection method according to a tenth embodiment of this application.

Specifically, as shown in FIG. 17, the detection method in this embodiment includes the following steps.

Step 311: Closing a first switch module.

As an example, before closing the first switch module, the control module determines that no shorted-to-power-supply fault occurs in the drive circuit of the electrical control device.

It needs to be noted that by precluding the shorted-to-power-supply fault in the drive circuit of the electrical control device, inaccuracy of the detection result caused by the shorted-to-power-supply fault in the drive circuit of the electrical control device is avoided.

Step 312: Obtaining a first electrical signal at a second end of a second detection module.

Specifically, after the first switch module is closed, the detection power module can supply power to the detection circuit. The control module may determine, based on the first electrical signal, whether the drive circuit of the electrical control device is normal.

Step 313: Determining whether a level of the first electrical signal is a preset first level.

Specifically, if a determining result is that the level of the first electrical signal is the preset first level, the process goes to step 314; or, if the level of the first electrical signal is not the preset first level, the process goes to step 315.

As an example, the second detection module includes a second power submodule, a second current-limiting submodule, and a switch transistor. The second power submodule is connected to a first end of the switch transistor by the second current-limiting submodule. A second end of the switch transistor serves as a third end of the second detection module. A control end of the switch transistor serves as a first end of the second detection module. The first end of the switch transistor serves as the second end of the second detection module. If the switch transistor is an N-type transistor, the first level is a low level. If the level of the first electrical signal is a low level after the first switch module is closed, it indicates that the switch transistor is enabled and the drive circuit of the electrical control device is normal. If the level of the first electrical signal is a high level, it indicates that the switch transistor is disabled, and therefore, the drive circuit of the electrical control device is abnormal.

Step 314: Determining that the drive circuit of the electrical control drive is normal. Then the process ends.

Step 315: Closing a second switch module, and obtaining a second electrical signal at a third end of the first detection module.

Step 316: Determining a fault type of the drive circuit of the electrical control device based on the second electrical signal.

Specifically, when an open-circuit fault exists in the drive circuit, the current output by the detection power module passes through the first detection module. If a shorted-to-ground fault exists in the drive circuit, an impedance of the detection power module to the ground is close to 0, and therefore, the current output by the detection power module will not pass through the first detection module. Therefore, the electrical signal at the third end of the first detection module differs depending on the type of fault occurring in the drive circuit. The control module can determine the fault type of the drive circuit of the electrical control device based on the second electrical signal.

Evidently, this embodiment is a method embodiment corresponding to the first to seventh embodiments, and this embodiment may be implemented in coordination with the first to seventh embodiments. Relevant technical details mentioned in the first to seventh embodiments are still applicable to this embodiment. For brevity, the details are omitted here. Correspondingly, the relevant technical details mentioned in this embodiment are applicable in the first to seventh embodiments.

An eleventh embodiment of this application relates to an electrical control device detection method. This embodiment is a further improvement of the detection method shown in FIG. 17 according to the tenth embodiment. The specific improvement is: before step 311, a step of determining whether a shorted-to-power-supply fault occurs in the drive circuit of the electrical control device is added, and step 316 is itemized.

Figure 18:
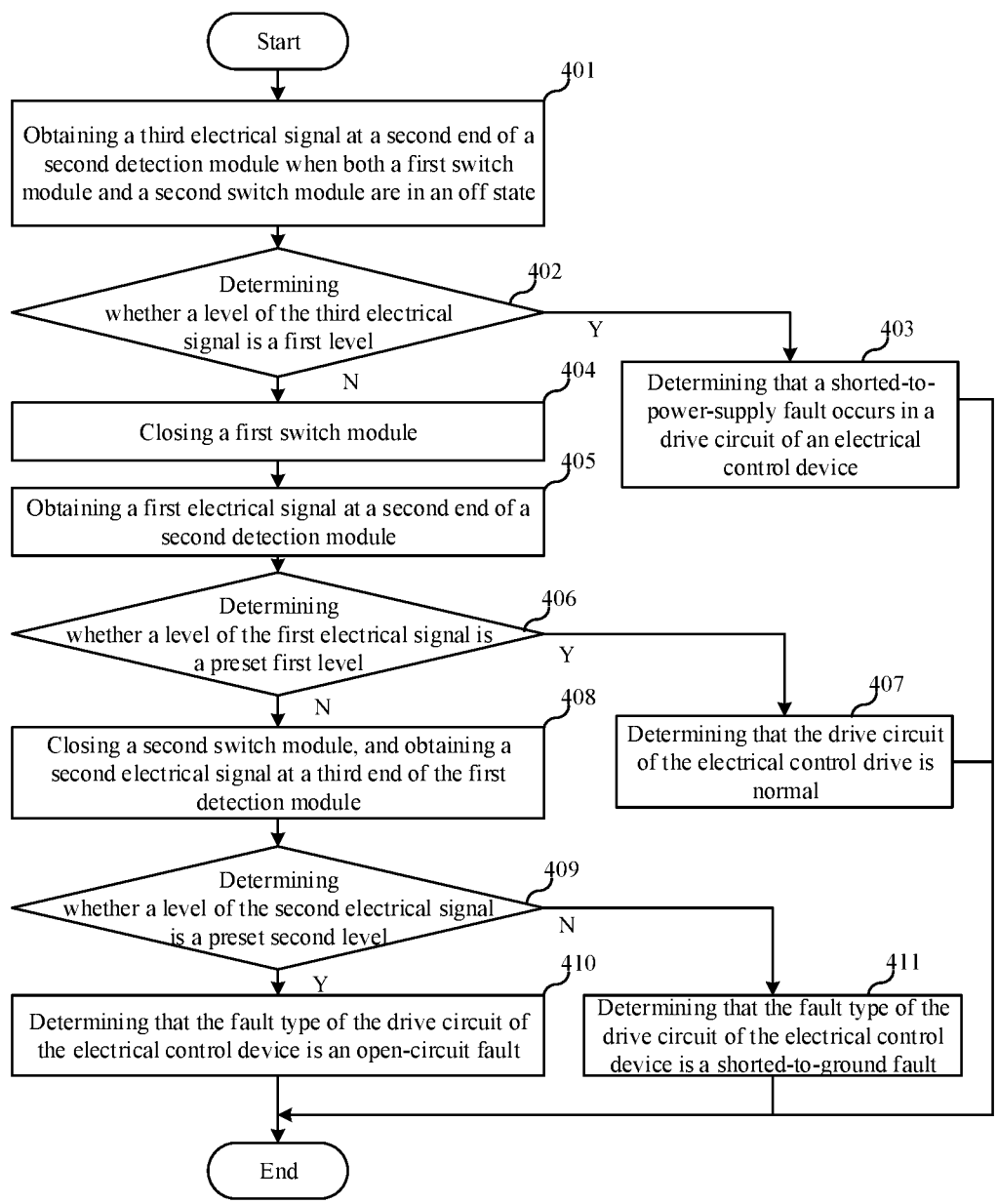
FIG. 18 is a flowchart of an electrical control device detection method according to an eleventh embodiment of this application.

Specifically, as shown in FIG. 18, the electrical control device detection method includes steps 401 to 411. Steps 404 to 408 are substantially the same as steps 311 to 315 of the tenth embodiment, details of which are omitted here. The following primarily describes the differences.

Step 401: Obtaining a third electrical signal at the second end of the second detection module when both the first switch module and the second switch module are in an off state.

Specifically, the electrical signal at the second end of the second detection module differs depending on whether a shorted-to-power-supply fault occurs in the drive circuit or not. Therefore, based on the electrical signal at the second end of the second detection module, the control module can determine whether a fault occurs in the drive circuit of the electrical control device.

Step 402: Determining whether a level of the third electrical signal is the first level.

Specifically, if a determining result is that the level of the first electrical signal is the preset first level, the process goes to step 403; or, if the level of the first electrical signal is not the preset first level, the process goes to step 404.

Because the first switch module and the high-side switch unit are not enabled, normally the switch transistor of the second detection module is not conducted, and the level of the electrical signal at the first end of the switch transistor is normally not the first level. If a shorted-to-power-supply fault occurs in the drive circuit, the switch transistor will be enabled, so that the level at the first end of the switch transistor is the first level. Therefore, based on the electrical signal at the second end of the second detection module, the control module can determine whether a shorted-to-power-supply fault occurs in the drive circuit.

As an example, the switch transistor is an N-type transistor, and the first level is a low level.

It needs to be noted that when the structure of the second detection module changes, the first level may be a high level. For example, if the switch transistor is a P-type transistor, the preset first level is a high level. The embodiment does not limit whether the first level is a low level or a high level.

Step 403: determining that a shorted-to-power-supply fault occurs in the drive circuit of the electrical control device. Then the process ends.

Step 404: Closing a first switch module.

Step 405: Obtaining a first electrical signal at a second end of a second detection module.

Step 406: Determining whether a level of the first electrical signal is a preset first level.

Specifically, if a determining result is that the level of the first electrical signal is the preset first level, the process goes to step 407; or, if the level of the first electrical signal is not the preset first level, the process goes to step 408.

Step 407: Determining that the drive circuit of the electrical control drive is normal. Then the process ends.

Step 408: Closing a second switch module, and obtaining a second electrical signal at a third end of the first detection module.

Step 409: Determining whether a level of the second electrical signal is a preset second level.

Specifically, if a determining result is that the level of the first electrical signal is the preset first level, the process goes to step 410; or, if the level of the first electrical signal is not the preset first level, the process goes to step 411.

As an example, the first detection module includes a first power submodule, a filter submodule, a first current-limiting submodule, and a switch element. The second level is a high level. A first end of the switch element serves as the first end of the first detection module. A second end of the switch element serves as the second end of the first detection module. A third end of the switch element is connected to the first power submodule by the first current-limiting submodule. A fourth end of the switch element is connected to a first end of the filter submodule. A second end of the filter submodule is grounded. A third end of the filter submodule serves as the third end of the first detection module. When a current flows from the first end of the switch element to the second end of the switch element, an electrically conductive path is formed between the third end of the switch element and the fourth end of the switch element. When an open-circuit fault occurs in the drive circuit, the current output by the detection power module flows through the first end of the switch element and the second end of the switch element. An electrically conductive path is formed between the third end of the switch element and the fourth end of the switch element. Therefore, the level of the electrical signal at the fourth end of the switch element is the second level. When a shorted-to-ground fault occurs in the drive circuit, an output end of the detection power module achieves an equivalent effect of being connected to the ground, and no current flows between the first end of the switch element and the second end of the switch element, and no electrically conductive path can be formed between the third end of the switch element and the fourth end of the switch element. Therefore, the level of the electrical signal at the fourth end of the switch element is not the second level.

Step 410: Determining that the fault type of the drive circuit of the electrical control device is an open-circuit fault. Then the process ends.

Step 411: Determining that the fault type of the drive circuit of the electrical control device is a shorted-to-ground fault.

Evidently, this embodiment is a method embodiment corresponding to the first to seventh embodiments, and this embodiment may be implemented in coordination with the first to seventh embodiments. Relevant technical details mentioned in the first to seventh embodiments are still applicable to this embodiment. For brevity, the details are omitted here. Correspondingly, the relevant technical details mentioned in this embodiment are applicable in the first to seventh embodiments.

A twelfth embodiment of this application relates to an electrical control device detection method. This embodiment exemplifies a process mentioned in the ninth embodiment, that is, a process by which the control module determines, based on the electrical signal at the second end of the second detection module, whether a fault occurs in the drive circuit of the electrical control device.

Figure 19:
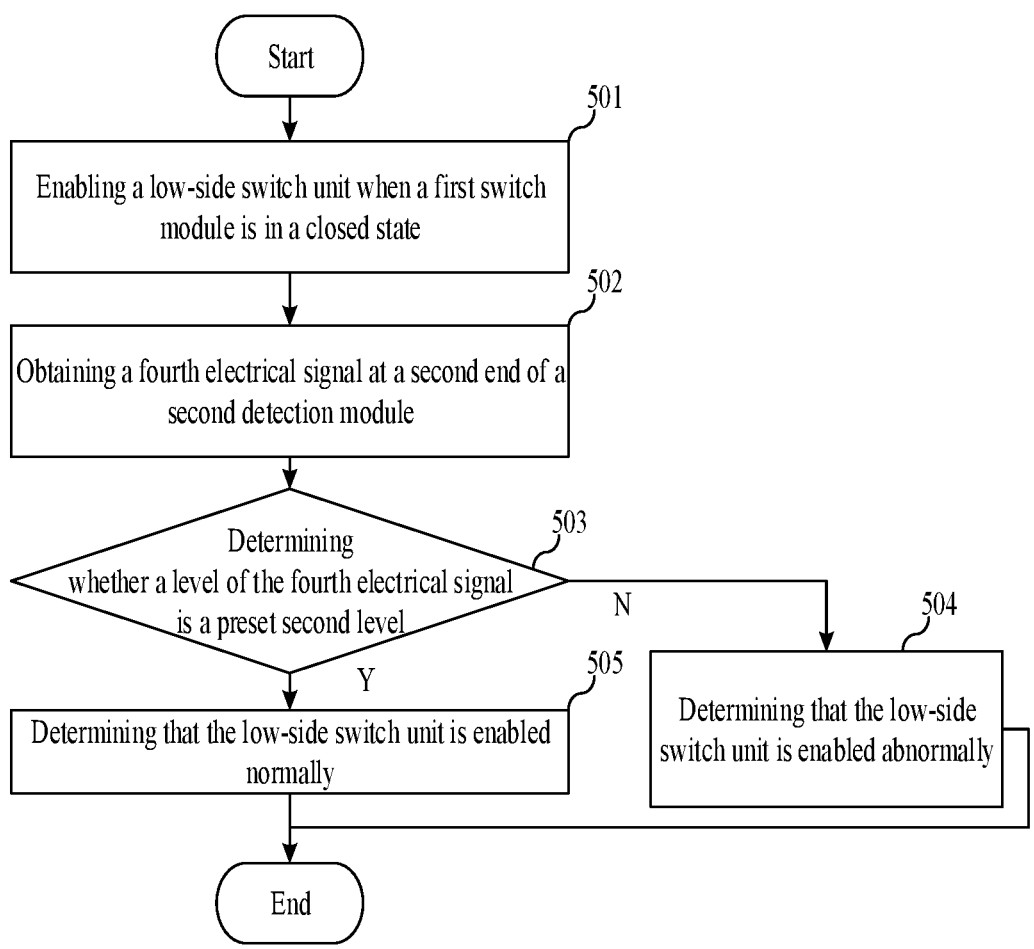
FIG. 19 is a flowchart of an electrical control device detection method according to a twelfth embodiment of this application.

Specifically, as shown in FIG. 19, the detection method in this embodiment includes the following steps.

Step 501: Enabling a low-side switch unit when a first switch module is in a closed state.

Step 502: Obtaining a fourth electrical signal at a second end of a second detection module.

Specifically, in a case that the first switch module is closed, if the low-side switch unit is enabled normally, the electrical signal at the first end of the low-side switch unit is a low-level signal. If the low-side switch unit is enabled abnormally, the electrical signal at the first end of the low-side switch unit is a high-level signal. Therefore, the signal detected by the second detection module is different. The control module can determine, based on the fourth electrical signal detected by the second detection module, whether the low-side switch unit is enabled normally.

Step 503: Determining whether a level of the fourth electrical signal is a preset second level.

Specifically, if a determining result is that the level of the fourth electrical signal is not the preset second level, the process goes to step 504; or, if a determining result is that the level of the fourth electrical signal is the preset second level, the process goes to step 505.

As an example, the second detection module includes a second power submodule, a second current-limiting submodule, and a switch transistor. The second power submodule is connected to a first end of the switch transistor by the second current-limiting submodule. A control end of the switch transistor serves as a first end of the second detection module. A first end of the switch transistor serves as a second end of the second detection module. A second end of the switch transistor serves as a third end of the second detection module. If the switch transistor is an N-type transistor, the second level is a high level. If the level of the fourth electrical signal is not a high level, it indicates that the switch transistor is enabled, a high-level signal exists at the control end of the switch transistor, and the low-side switch unit is enabled abnormally. If the level of the fourth electrical signal is a high level, it indicates that the switch transistor is disabled, the control end of the switch transistor carries a low-level signal, and the low-side switch unit is enabled normally.

It needs to be noted that a person skilled in the art understands that the preset second level may vary with the circuit structure of the second detection module. For example, when the switch transistor is an N-type transistor, the second level is a low level. Therefore, this embodiment does not limit whether the second level is a low level or a high level.

Step 504: Determining that the low-side switch unit is enabled abnormally. Then the process ends.

Step 505: Determining that the low-side switch unit is enabled normally.

As a first example, after it is determined that the low-side switch unit is enabled normally, the drive power module may be detected. Specifically, the control module turns off the first switch module and the low-side switch unit; obtains a fifth electrical signal at the second end of the third detection module; and determines whether a voltage of the fifth electrical signal falls within a preset range. If it is determined that the voltage of the fifth electrical signal does not fall within the preset range, the control module determines that the drive power module is abnormal; or, if it is determined that the voltage of the fifth electrical signal falls within the preset range, the control module determines that the drive power module is normal. When the drive power module is normal, the voltage of the electrical signal at the first end of the high-side switch unit is close to an output voltage of the drive power module. Therefore, if the drive power module is abnormal, the voltage of the electrical signal at the first end of the high-side switch unit is far higher or far lower than the output voltage of the drive power module. Therefore, the control module can determine, based on the voltage of the fifth electrical signal, whether the drive power module is normal.

It needs to be noted that, a person skilled in the art understands that the preset range may be determined based on a power supply voltage of the drive power module. For example, the preset range is (power supply voltage of the drive power module−M, power supply voltage of the drive power module+M), where M is a positive number greater than 0.

As a second example, after it is determined that the low-side switch unit is enabled normally, or after it is determined that the low-side switch unit is enabled normally and the drive power module is normal, the control module turns off the low-side switch unit and the first switch module, and enables the high-side switch unit; obtains a sixth electrical signal at the second end of the second detection module; and determines whether a level of the sixth electrical signal is a first level; determining, if a determining result is that the level of the sixth electrical signal is the first level, that the high-side switch unit is enabled normally; or determining, if a determining result is that the level of the sixth electrical signal is not the first level, that the high-side switch unit is enabled abnormally.

Specifically, when the low-side switch unit is turned off, the high-side switch unit is enabled. If the high-side switch unit is enabled normally, the first end of the second detection module carries a voltage, and the level of the sixth electrical signal is the first level. If the high-side switch unit is enabled abnormally, the first end of the second detection module carries no voltage, and the level of the sixth electrical signal is not the first level.

It needs to be noted that a person skilled in the art understands that the detection of the drive power module, the high-side switch unit, and the low-side switch unit is not a necessary step. In practical applications, the detection may be performed selectively on the drive power module alone, the high-side switch unit alone, or the low-side switch unit alone, or any combination thereof. The order of detection performed on the selected units or modules such as the drive power module, the high-side switch unit, and the low-side switch unit may be set as required.

In contrast with the prior art, in this embodiment, the detection circuit can detect the drive power module, the high-side switch unit, and the low-side switch unit separately, and locate the fault more accurately, thereby facilitating quick repair by maintenance personnel and avoiding problems such as economic losses caused by a too long fault time.

Evidently, this embodiment is a method embodiment corresponding to the sixth embodiment, and this embodiment may be implemented in coordination with the sixth embodiment. Relevant technical details mentioned in the sixth embodiment are still applicable to this embodiment. For brevity, the details are omitted here. Correspondingly, the relevant technical details mentioned in this embodiment are applicable in the sixth embodiment.

A thirteenth embodiment of this application relates to an electrical control device detection method. This embodiment exemplifies a process mentioned in the ninth embodiment, that is, a process by which the control module determines, based on the electrical signal at the third end of the first detection module, whether a fault occurs in the drive circuit of the electrical control device.

Figure 20:
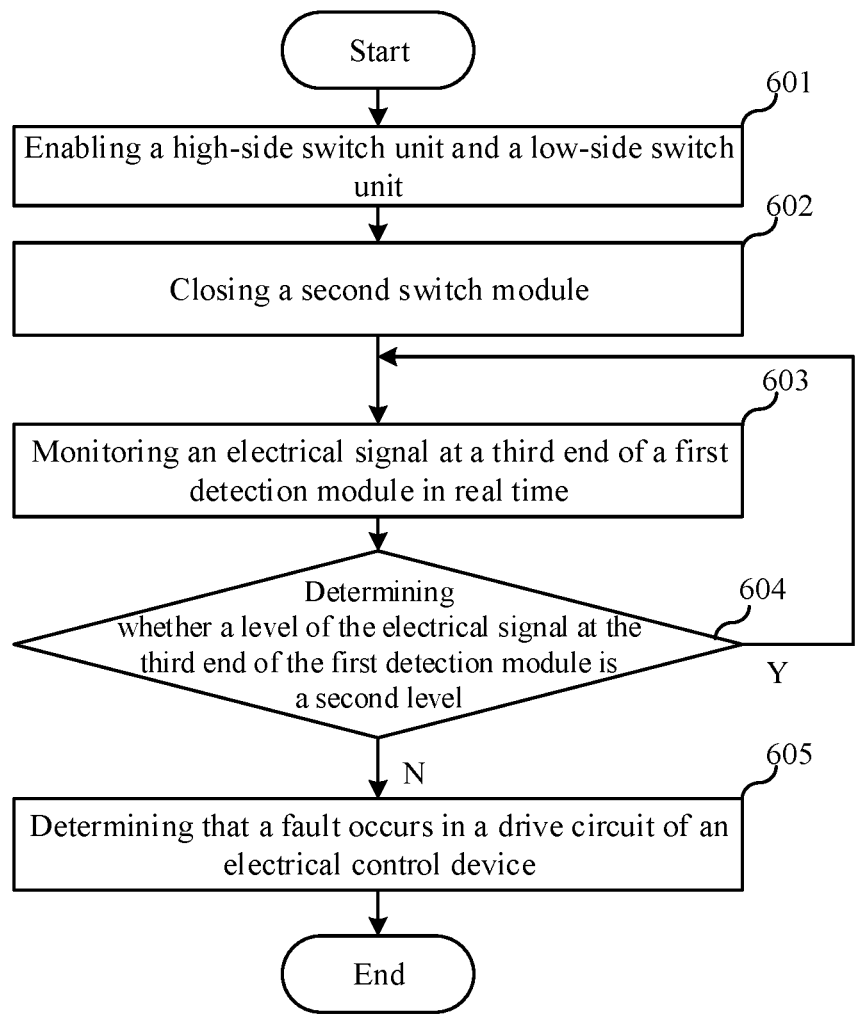
FIG. 20 is a flowchart of an electrical control device detection method according to a thirteenth embodiment of this application.

Specifically, as shown in FIG. 20, the detection method in this embodiment includes the following steps.

Step 601: Enabling a high-side switch unit and a low-side switch unit.

Step 602: Closing a second switch module.

Step 603: Monitoring an electrical signal at a third end of a first detection module in real time.

Step 604: Determining whether a level of the electrical signal at the third end of the first detection module is a second level.

Specifically, if a determining result is that the level of the electrical signal is not the preset second level, the process goes to step 605; or, if the level of the electrical signal is the preset second level, the process returns to step 603.

Step 605: Determining that a fault occurs in a drive circuit of an electrical control device.

As an example, the electrical control device is a relay, and the first detection module includes a first power submodule, a first current-limiting submodule, a filter submodule, and a switch element. A first end of the switch element serves as the first end of the first detection module. A second end of the switch element serves as the second end of the first detection module. A third end of the switch element is connected to the first power submodule by the first current-limiting submodule. A fourth end of the switch element is connected to a first end of the filter submodule. A second end of the filter submodule is grounded. A third end of the filter submodule serves as the third end of the first detection module. The switch element is a photocoupler. After the control module closes the second switch module, a light-emitting diode in the photocoupler is parallel-connected to a coil of the relay. In this case, if the voltage across the coil of the relay is a normal drive voltage, a light receiving end of the photocoupler will be turned on, and a high-level voltage exists at the third end of the second detection module. When the control module determines that no high-level voltage is detected at the third end of the second detection module, the following faults may occur: the high-side switch unit is turned off, a shorted-to-ground fault occurs at the second end of the relay, a shorted-to-power-supply fault occurs at the first end of the relay, and the low-side switch unit is turned off. Therefore, by monitoring the electrical signal at the third end of the first detection module, the control module can detect whether the drive circuit of the relay is normal.

It needs to be noted that the applicant finds that in all existing detection solutions for the drive circuit of the relay, it is impracticable to detect the drive circuit of the relay when the relay is enabled. Therefore, with the detection circuit disclosed in this embodiment of this application, by monitoring the electrical signal at the third end of the first detection module, the control module can detect a normal or faulty state of the drive circuit of the electrical control device when the electrical control device is working, thereby discovering in time an abnormal working state of the electrical control device caused by the fault in the drive circuit of the electrical control device.

It needs to be noted that a person skilled in the art understands that, this embodiment may be combined with the tenth embodiment. For example, when this embodiment is combined with the tenth embodiment, in the determining step in step 313, if it is determined that the level of the first electrical signal is the first level, then the detection steps of the low-side switch unit (steps 501 to 505), the detection steps of the drive power module (in the first example), and the detection steps of the high-side switch unit (in the second example) mentioned in this embodiment are performed. If it is determined that the low-side switch unit is enabled normally, the drive power module is normal, and the high-side switch unit is enabled normally, step 314 is performed, and then steps 601 to 605 are performed.

In contrast with the prior art, in the electrical control device detection circuit provided in this embodiment, the control module can monitor the drive circuit of the electrical control device when the electrical control device is enabled, thereby improving safety performance of a system that uses the electrical control device.

Evidently, this embodiment is a method embodiment corresponding to the first to seventh embodiments, and this embodiment may be implemented in coordination with the first to seventh embodiments. Relevant technical details mentioned in the first to seventh embodiments are still applicable to this embodiment. For brevity, the details are omitted here. Correspondingly, the relevant technical details mentioned in this embodiment are applicable in the first to seventh embodiments.

Figure 21:
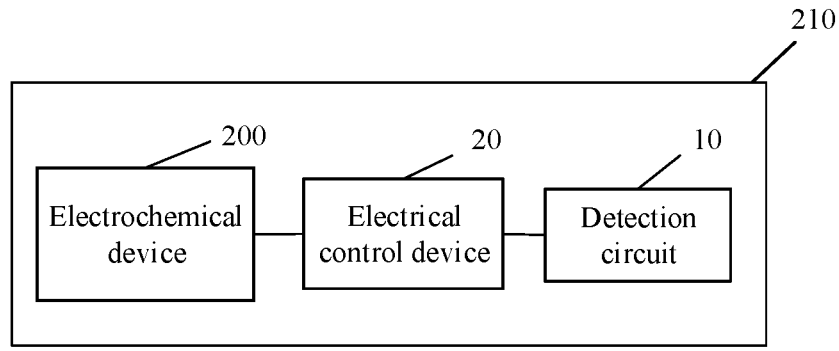
FIG. 21 is a schematic structural diagram of an electric vehicle according to an embodiment of this application.

An embodiment of this application further provides an electric vehicle. As shown in FIG. 21, the electric vehicle 210 includes an electrochemical device 200, an electrical control device 20, and any detection circuit 10 described in the foregoing embodiments. The electrochemical device may be a battery pack that provides electrical power for the electric vehicle. The electrical control device may be a relay or another device that uses a low current to control its status. The detection circuit is configured to detect a drive circuit of the electrical control device. The drive circuit of the electrical control device may include a drive power module and a switch unit. The switch unit includes a low-side switch unit and a high-side switch unit. The specific composition of the detection circuit is omitted here because it has been described in detail in the foregoing embodiments.

The arrangement of steps in each method described above is merely for clarity of description. During implementation, the steps may be combined into one step or some steps may be divided into a plurality of steps, and the combination and division fall within the protection scope of this patent as long as the same logical relationship is incorporated. Adding insignificant modifications and introducing insignificant design into an algorithm or process herein without changing the core design of the algorithm and process fall within the protection scope of this patent.

A person of ordinary skill in the art understands that the embodiments described above are detailed embodiments for implementing this application. In practical applications, various modifications may be made in form and detail to the embodiments without departing from the spirit and scope of this application.

What is claimed is:

1. An electrical control device detection circuit for detecting a drive circuit of an electrical control device, wherein the drive circuit of the electrical control device comprises a drive power module, a high-side switch unit, and a low-side switch unit, the drive power module is connected to a first end of the high-side switch unit, a second end of the high-side switch unit is connected to a first end of the electrical control device, a first end of the low-side switch unit is connected to a second end of the electrical control device, and a second end of the low-side switch unit is grounded; and the electrical control device detection circuit comprises: a detection power module, a first switch module, a second switch module, a first detection module, a second detection module, and a control module;

an output end of the detection power module is connected to a first end of the first switch module, a second end of the first switch module is connected to the first end of the electrical control device, a first end of the first detection module is connected to a first node between the second end of the first switch module and the first end of the electrical control device, a second end of the first detection module is connected to the second end of the electrical control device, and a third end of the first detection module is connected to the control module; a first end of the second detection module is connected to a second node between the second end of the electrical control device and the second end of the first detection module, a second end of the second detection module is connected to the control module, and a third end of the second detection module is grounded; the first switch module and the second switch module are connected to the control module separately; and the second switch module is serially connected between the first end of the first detection module and the first node, or, the second switch module is serially connected between the second end of the first detection module and the second node; and the control module is configured to:
obtain an electrical signal at the third end of the first detection module, and determine, based on the electrical signal at the third end of the first detection module, whether a fault occurs in the drive circuit of the electrical control device; or obtain an electrical signal at the second end of the second detection module, and determine, based on the electrical signal at the second end of the second detection module, whether a fault occurs in the drive circuit of the electrical control device; or obtain an electrical signal at the third end of the first detection module and an electrical signal at the second end of the second detection module, and determine, based on the electrical signal at the third end of the first detection module and the electrical signal at the second end of the second detection module, whether a fault occurs in the drive circuit of the electrical control device.

2. The electrical control device detection circuit according to claim 1, wherein the first detection module comprises a first power submodule, a first current-limiting submodule, and a switch element; a first end of the switch element serves as the first end of the first detection module, and a second end of the switch element serves as the second end of the first detection module; and a third end of the switch element is connected to the first power submodule by the first current-limiting submodule, a fourth end of the switch element is grounded, and the third end of the switch element serves as the third end of the first detection module; or a third end of the switch element is connected to the first power submodule, a fourth end of the switch element is connected to a first end of the first current-limiting submodule, a second end of the first current-limiting submodule is grounded, and the first end of the first current-limiting submodule serves as the third end of the first detection module;

wherein, when a current flows from the first end of the switch element to the second end of the switch element, an electrically conductive path is formed between the third end of the switch element and the fourth end of the switch element.

3. The electrical control device detection circuit according to claim 2, wherein the first detection module further comprises a filter module, and the third end of the first detection module is connected to the control module by the filter module.

4. The electrical control device detection circuit according to claim 1, wherein the first detection module comprises: a first power submodule, a filter submodule, a first current-limiting submodule, and a switch element; a first end of the switch element serves as the first end of the first detection module, and a second end of the switch element serves as the second end of the first detection module; and a third end of the switch element is connected to the first power submodule by the first current-limiting submodule, a fourth end of the switch element is connected to a first end of the filter submodule, a second end of the filter submodule is grounded, and a third end of the filter submodule serves as the third end of the first detection module.

5. The electrical control device detection circuit according to claim 1, further comprising a first current-limiting module; and the first end of the first detection module is connected to the first node by the first current-limiting module.

6. The electrical control device detection circuit according to claim 1, wherein the second detection module comprises a second power submodule, a second current-limiting submodule, and a switch transistor, the second power submodule is connected to a first end of the switch transistor by the second current-limiting submodule, a second end of the switch transistor serves as the third end of the second detection module, a control end of the switch transistor serves as the first end of the second detection module, and the first end of the switch transistor serves as the second end of the second detection module.

7. The electrical control device detection circuit according to claim 1, further comprising a second current-limiting module, and the second end of the second detection module is connected to the control module by the second current-limiting module.

8. The electrical control device detection circuit according to claim 1, wherein the detection power module comprises a third power submodule and a voltage divider submodule, the third power submodule is connected to a first end of the voltage divider submodule, and a second end of the voltage divider submodule serves as an output end of the detection power module.

9. The electrical control device detection circuit according to claim 1, further comprising a freewheeling module, and the freewheeling module is parallel-connected to the electrical control device.

10. The electrical control device detection circuit according to claim 1, further comprising a third detection module, a first end of the third detection module is connected to the first end of the high-side switch unit, a second end of the third detection module is connected to the control module, the control module is further configured to determine, based on an electrical signal at the second end of the third detection module, whether a fault occurs in the drive power module.

11. The electrical control device detection circuit according to claim 1, wherein the control module comprises a processing submodule and a first multiplexing submodule, and the processing submodule is connected to the third end of the first detection module and the second end of the second detection module by the first multiplexing submodule separately.

12. The electrical control device detection circuit according to claim 1, wherein the control module comprises a processing submodule and a second multiplexing submodule, and the processing submodule is connected to the high-side switch unit and the low-side switch unit by the second multiplexing submodule separately.

13. An electrical control device detection method applied to a control module in an electrical control device detection circuit according to claim 1, and the electrical control device detection method comprising:
    obtaining an electrical signal at the third end of the first detection module, and determining, based on the electrical signal at the third end of the first detection module, whether a fault occurs in the drive circuit of the electrical control device; or
    obtaining an electrical signal at the second end of the second detection module, and determining, based on the electrical signal at the second end of the second detection module, whether a fault occurs in the drive circuit of the electrical control device; or
    obtaining an electrical signal at the third end of the first detection module and an electrical signal at the second end of the second detection module, and determining, based on the electrical signal at the third end of the first detection module and the electrical signal at the second end of the second detection module, whether a fault occurs in the drive circuit of the electrical control device.

14. The electrical control device detection method according to claim 13, wherein, the obtaining an electrical signal at a third end of a first detection module and an electrical signal at a second end of a second detection module, and determining, based on the electrical signal at the third end of the first detection module and the electrical signal at the second end of the second detection module, whether a fault occurs in a drive circuit of the electrical control device specifically comprises:
    closing a first switch module when a low-side switch unit is in a disabled state;
    obtaining a first electrical signal at the second end of the second detection module; and
    closing a second switch module when it is determined that a level of the first electrical signal is not a preset first level, and obtaining a second electrical signal at the third end of the first detection module; and
    determining a fault type of the drive circuit of the electrical control device based on the second electrical signal.

15. The electrical control device detection method according to claim 14, wherein the determining a fault type of the drive circuit of the electrical control device based on the second electrical signal specifically comprises:
    determining whether a level of the second electrical signal is a preset second level;
    determining, if a determining result is that the level of the second electrical signal is the preset second level, that the fault type of the drive circuit of the electrical control device is an open-circuit fault; or
    determining, if a determining result is that the level of the second electrical signal is not the preset second level, that the fault type of the drive circuit of the electrical control device is a shorted-to-ground fault.

16. The electrical control device detection method according to claim 14, wherein, before closing the first switch module, the electrical control device detection method further comprises:
- determining that no shorted-to-power-supply fault occurs in the drive circuit of the electrical control device.

17. The electrical control device detection method according to claim 16, wherein a method for determining whether a shorted-to-power-supply fault occurs in the drive circuit of the electrical control device is:
- obtaining a third electrical signal at the second end of the second detection module when both the first switch module and the second switch module are in an off state;
- determining whether a level of the third electrical signal is the first level;
- determining, if a determining result is that the level of the third electrical signal is the first level, that a shorted-to-power-supply fault occurs in the drive circuit of the electrical control device; or
- determining, if a determining result is that the level of the third electrical signal is not the first level, that no shorted-to-power-supply fault occurs in the drive circuit of the electrical control device.

18. The electrical control device detection method according to claim 13, wherein the "obtaining an electrical signal at a second end of a second detection module, and determining, based on the electrical signal at the second end of the second detection module, whether a fault occurs in a drive circuit of the electrical control device" specifically comprises:
- enabling a low-side switch unit when a first switch module is in a closed state;
- obtaining a fourth electrical signal at the second end of the second detection module; and
- determining whether a level of the fourth electrical signal is a preset second level;
- determining, if a determining result is that the level of the fourth electrical signal is the preset second level, that the low-side switch unit is enabled normally; or
- determining, if a determining result is that the level of the fourth electrical signal is not the preset second level, that the low-side switch unit is enabled abnormally.

19. The electrical control device detection method according to claim 18, wherein after determining that the low-side switch unit is enabled normally, the electrical control device detection method further comprises:
- turning off the first switch module and the low-side switch unit;
- obtaining a fifth electrical signal at a second end of a third detection module;
- determining whether a voltage of the fifth electrical signal falls within a preset range;
- determining, if a determining result is that the voltage of the fifth electrical signal falls within the preset range, that a drive power module is normal; or
- determining, if a determining result is that the voltage of the fifth electrical signal does not fall within the preset range, that a drive power module is abnormal.

20. The electrical control device detection method according to claim 18, wherein after determining that the low-side switch unit is enabled normally, the electrical control device detection method further comprises:
- turning off the low-side switch unit and the first switch module, and enabling a high-side switch unit;
- obtaining a sixth electrical signal at the second end of the second detection module;
- determining whether a level of the sixth electrical signal is a preset first level;
- determining, if a determining result is that the level of the sixth electrical signal at the second end of the second detection module is the preset first level, that the high-side switch unit is enabled normally; or
- determining, if a determining result is that the level of the sixth electrical signal at the second end of the second detection module is not the preset first level, that the high-side switch unit is enabled abnormally.

21. The electrical control device detection method according to claim 13, wherein the "obtaining an electrical signal at a third end of a first detection module, and determining, based on the electrical signal at the third end of the first detection module, whether a fault occurs in a drive circuit of an electrical control device" specifically comprises:
- closing a second switch module when a high-side switch unit and a low-side switch unit are in an enabled state and a first switch module is in an off state; and
- monitoring the electrical signal at the third end of the first detection module in real time; and
- determining, if it is determined that a level of the electrical signal at the third end of the first detection module is not a second level, that a fault occurs in the drive circuit of the electrical control device.

22. An electric vehicle, comprising an electrochemical device, an electrical control device, and the electrical control device detection circuit according to claim 1.

* * * * *